United States Patent
Tanaka et al.

(10) Patent No.: US 12,456,669 B2
(45) Date of Patent: Oct. 28, 2025

(54) SEMICONDUCTOR DEVICE

(71) Applicant: SONY SEMICONDUCTOR SOLUTIONS CORPORATION, Kanagawa (JP)

(72) Inventors: Yuto Tanaka, Kanagawa (JP); Shuichi Oka, Kanagawa (JP); Shun Mitarai, Kanagawa (JP); Kiwamu Adachi, Kanagawa (JP); Takahiro Igarashi, Kanagawa (JP); Hiizu Ohtorii, Kanagawa (JP); Naoki Kakoiyama, Kanagawa (JP); Kousuke Seki, Kanagawa (JP); Hiroyuki Shigeta, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 508 days.

(21) Appl. No.: 17/906,847

(22) PCT Filed: Mar. 23, 2021

(86) PCT No.: PCT/JP2021/012062
§ 371 (c)(1),
(2) Date: Sep. 20, 2022

(87) PCT Pub. No.: WO2021/200406
PCT Pub. Date: Oct. 7, 2021

(65) Prior Publication Data
US 2023/0125605 A1   Apr. 27, 2023

(30) Foreign Application Priority Data
Mar. 31, 2020   (JP) .................. 2020-065086

(51) Int. Cl.
*H01L 23/498* (2006.01)
*H01L 21/48* (2006.01)
(Continued)

(52) U.S. Cl.
CPC ...... *H01L 23/49827* (2013.01); *H01L 21/486* (2013.01); *H01L 23/544* (2013.01);
(Continued)

(58) Field of Classification Search
CPC ............ H01L 23/49827; H01L 21/486; H01L 23/544; H01L 23/562; H01L 23/49894;
(Continued)

(56) References Cited

U.S. PATENT DOCUMENTS

2011/0032685 A1* 2/2011 Akiba ............... H01L 23/66
                                                    361/783
2014/0015121 A1   1/2014 Koizumi
2019/0067350 A1* 2/2019 Fukuda ............ H10F 39/804

FOREIGN PATENT DOCUMENTS

JP   H07106464 A    4/1995
JP   2011-258654 A  12/2011
(Continued)

OTHER PUBLICATIONS

International Search Report and Written Opinion of PCT Application No. PCT/JP2021/012062, issued on Jun. 22, 2021, 11 pages of ISRWO.

*Primary Examiner* — Patricia D Valenzuela
(74) *Attorney, Agent, or Firm* — CHIP LAW GROUP

(57) ABSTRACT

Provided is a semiconductor device capable of maintaining the flatness of a glass substrate and sufficiently protecting an end portion of the glass substrate. The semiconductor device includes a glass substrate including a first surface, a second surface opposite to the first surface, and a first side surface between the first surface and the second surface. The semi-
(Continued)

conductor device further includes wirings provided provided on the first and second surfaces, a first insulating film that covers the first surface, a second insulating film that covers the second surface, and a third insulating film that covers the first side surface, the third insulating film being continuous with at least one of the first or second insulating films.

44 Claims, 28 Drawing Sheets

(51) Int. Cl.
  *H01L 23/00* (2006.01)
  *H01L 23/544* (2006.01)
  *H01Q 1/38* (2006.01)
  *H10F 39/00* (2025.01)

(52) U.S. Cl.
  CPC .............. *H01L 23/562* (2013.01); *H01Q 1/38* (2013.01); *H10F 39/804* (2025.01); *H01L 23/49894* (2013.01); *H01L 24/16* (2013.01); *H01L 24/32* (2013.01); *H01L 24/48* (2013.01); *H01L 24/73* (2013.01); *H01L 2223/54426* (2013.01); *H01L 2224/16227* (2013.01); *H01L 2224/32225* (2013.01); *H01L 2224/48091* (2013.01); *H01L 2224/48105* (2013.01); *H01L 2224/48227* (2013.01); *H01L 2224/73265* (2013.01)

(58) Field of Classification Search
  CPC ......... H01L 24/16; H01L 24/32; H01L 24/48; H01L 24/73; H01L 2223/54426; H01L 2224/16227; H01L 2224/32225; H01L 2224/48091; H01L 2224/48105; H01L 2224/48227; H01L 2224/73265; H01L 21/6835; H01L 23/3677; H01L 25/16; H01L 23/66; H01L 24/20; H01L 24/83; H01L 24/85; H01L 24/92; H01L 25/0652; H01L 25/167; H01L 2221/68345; H01L 2223/54486; H01L 2223/6677; H01L 2224/04105; H01L 2224/73267; H01L 2224/81132; H01L 2224/83132; H01L 2224/85132; H01L 2224/92244; H01L 2924/00014; H01L 2924/12043; H01L 2924/15153; H01L 2924/15313; H01L 2924/15788; H01L 2924/16788; H01L 2924/19041; H01L 2924/19042; H01L 2924/19043; H01L 2924/19105; H01L 2924/3511; H01L 2924/3512; H01L 23/15; H01Q 1/38; H10F 39/804; H10F 39/811

See application file for complete search history.

(56) References Cited

FOREIGN PATENT DOCUMENTS

| | | | |
|---|---|---|---|
| JP | 2014022465 | A | 2/2014 |
| JP | 2016208057 | A | 12/2016 |
| JP | 2017-084843 | A | 5/2017 |
| JP | 6201663 | B2 | 9/2017 |
| JP | 2017-224672 | A | 12/2017 |
| JP | 6369436 | B2 | 8/2018 |
| WO | 2001/82367 | A1 | 11/2001 |
| WO | 2017/086222 | A1 | 5/2017 |
| WO | 2017/090223 | A1 | 6/2017 |
| WO | 2019/073801 | A1 | 4/2019 |
| WO | 2020/003732 | A1 | 1/2020 |

* cited by examiner

SEMICONDUCTOR DEVICE

CROSS REFERENCE TO RELATED APPLICATIONS

This application is a U.S. National Phase of International Patent Application No. PCT/JP2021/012062 filed on Mar. 23, 2021, which claims priority benefit of Japanese Patent Application No. JP 2020-065086 filed in the Japan Patent Office on Mar. 31, 2020. Each of the above-referenced applications is hereby incorporated herein by reference in its entirety.

TECHNICAL FIELD

The present disclosure relates to a semiconductor device.

BACKGROUND ART

A glass substrate is promising as a substrate for a semiconductor device such as an optical component or a high-frequency component, because it has high surface flatness such that a semiconductor processing technique can be applied thereto. In order to put the glass substrate into practical use as a semiconductor substrate, it is necessary to maintain the flatness of the glass substrate and to suppress a crack in an end portion of the glass substrate. Therefore, it is important to protect the glass substrate.

CITATION LIST

Patent Document

Patent Document 1: Japanese Patent No. 6201663
Patent Document 2: Japanese Patent No. 6369436
Patent Document 3: Japanese Patent Application Laid-Open No. 2017-224672
Patent Document 4: Japanese Patent Application Laid-Open No. 2017-084843

SUMMARY OF THE INVENTION

Problems to be Solved by the Invention

Conventionally, vias and wiring layers are formed in a glass substrate in a panel state or a wafer state, and then the glass substrate is divided into individual pieces in a dicing process. In this case, when a resin used for wiring layers is cured, the resin shrinks, causing large stress. Thus, there is concern that a crack may occur in a side surface or a via of the glass when the residual stress of the resin is released at once in the dicing step for division into individual pieces.

In such a case, for example, when a complementary metal oxide semiconductor (CMOS) image sensor is mounted on the glass substrate, a crack may occur in the end portion of the glass substrate, which deteriorates the reliability of the semiconductor device.

Therefore, the present disclosure provides a semiconductor device capable of reducing stress applied to a glass substrate and sufficiently protecting an end portion of the glass substrate.

Solutions to Problems

According to one aspect of the present disclosure, a semiconductor device includes: a glass substrate including a first surface, a second surface opposite to the first surface, and a first side surface between the first surface and the second surface; wirings provided on the first and second surfaces; a first insulating film that covers the first surface; a second insulating film that covers the second surface; and a third insulating film that covers the first side surface, the third insulating film being continuous with at least one of the first and second insulating films.

The first to third insulating films may be continuously provided on the first side surface, the first surface, and the second surface.

The first to third insulating films may include the same material.

Partial portions of the wirings may directly contact the glass substrate on the first and second surfaces.

The number of layers of the wiring and the number of layers of the first insulating film on the first surface may be the same as the number of layers of the wiring and the number of layers of the second insulating film on the second surface, respectively.

The semiconductor device may further include a first metal film that covers an inner wall of a through hole penetrating through the glass substrate between the first surface and the second surface; and a fourth insulating film filled inside the first metal film in the through hole, and the fourth insulating film may include the same material as and be continuous with the first and second insulating films.

Each of the partial portions of the wirings directly contacting the glass substrate may have an opening above the through hole.

A side surface of the third insulating film may be flat.

The semiconductor device may further include a frame provided outside the third insulating film on the first side surface.

The frame may have a third surface on the same side as the first surface, a fourth surface on the same side as the second surface, and a second side surface facing the first side surface, the first insulating film may be provided continuously from the first surface to the third surface, and the second insulating film may be continuously provided from the second surface to the fourth surface.

The semiconductor may further include: a second metal film provided on the third surface of the frame; and a third metal film provided on the fourth surface of the frame.

The frame may include a material having a linear expansion coefficient substantially equal to that of the glass substrate.

The first side surface of the glass substrate may have a curved shape to protrude outward in a cross section in a direction perpendicular to the first surface.

The first side surface of the glass substrate may have a curved shape to protrude outward in a cross section in a direction perpendicular to the first surface, an inner side surface of the through hole may have a curved shape to protrude inward of the through hole in the cross section in the direction perpendicular to the first surface, and the first side surface may have a curvature substantially equal to that of the inner side surface of the through hole.

The semiconductor device may further include: a metal plate provided in a second through hole penetrating through the glass substrate between the first surface and the second surface; and a fifth insulating film provided between the second through hole and the metal plate and continuous with at least one of the first and second insulating films.

An inner wall surface of the second through hole and a side surface of the metal plate may be inclined with respect to the first surface or the second surface.

The semiconductor device may further include an alignment mark provided on the first surface of the glass substrate.

The second and third metal films may be used as antennas for wireless communication.

An antenna may be mounted on the first surface of the glass substrate.

A semiconductor chip may be mounted on the first surface of the glass substrate.

The semiconductor chip may be an image sensor chip.

According to one aspect of the present disclosure, a semiconductor device includes: a glass substrate including a first surface, a second surface opposite to the first surface, and a first side surface between the first surface and the second surface, the glass substrate having a fastening hole penetrating therethrough between the first surface and the second surface; wiring layers provided on the first and second surfaces; a semiconductor chip provided above the glass substrate; a housing provided around the semiconductor chip; a lens provided in the housing; and a fastener that fastens the glass substrate and the housing to each other via the fastening hole.

The fastening hole may be larger than an outer diameter of a head of the fastener in plan view when the fastening hole is viewed in a fastened direction of the fastener.

The semiconductor device may further include a filler that fills a space between the fastener and the fastening hole.

The fastening hole may be connected to the outside on the side surface of the glass substrate.

A plurality of fastening holes may be provided in the glass substrate, and the center between the plurality of fastening holes may overlap the semiconductor chip in plan view when the plurality of fastening holes is viewed in the fastened direction.

The fastener may fasten the housing and the glass substrate to each other so that an optical axis of the lens and an optical axis of the semiconductor chip substantially coincide with each other.

The glass substrate may have a through hole penetrating therethrough between the first surface and the second surface, and the semiconductor device may further include an electronic component provided in the through hole and connected to one of the wirings.

The frame may have a through hole penetrating therethrough between the third surface and the fourth surface, and the semiconductor device may further include an electronic component provided in the through hole and connected to one of the wirings.

The glass substrate may have a counterbore provided in the first surface, and the semiconductor device may further include an electronic component provided in the counterbore and connected to one of the wirings.

The frame may have a counterbore provided in the third surface, and the semiconductor device may further include an electronic component provided in the counterbore and connected to one of the wirings.

A plurality of electronic components having different thicknesses may be provided in the through hole, and surfaces of the plurality of electronic components may be aligned with the first surface.

A plurality of electronic components having different thicknesses may be provided in the through hole, and surfaces of the plurality of electronic components may be aligned with the first surface.

A plurality of electronic components having different thicknesses may be provided in a plurality of counterbores having different depths, respectively, and surfaces of the plurality of electronic components may be aligned with the first surface.

A plurality of electronic components having different thicknesses may be provided in a plurality of counterbores having different depths, respectively, and surfaces of the plurality of electronic components may be aligned with the first surface.

The glass substrate may have a through hole penetrating therethrough between the first surface and the second surface, the semiconductor device may further include a heat dissipation member provided in the through hole and having a second through hole, and the electronic component may be provided in the second through hole.

The semiconductor device may further include a heat dissipation member provided in the through hole and having a second counterbore, and the electronic component may be provided in the second counterbore.

The semiconductor device may further include: a glass frame of which one end is directly connected to the first surface of the glass substrate and which is provided to surround a periphery of the semiconductor chip; and a cover glass connected to the other end of the glass frame to cover an upper side of the semiconductor chip.

The semiconductor device may further include: a glass frame of which one end is directly connected to the first surface of the glass substrate and which is provided to surround a periphery of the semiconductor chip; and a cover glass connected to the other end of the glass frame to cover an upper side of the semiconductor chip.

The glass frame and the cover glass may be integrally formed.

The glass frame and the cover glass may be integrally formed.

The glass frame and the cover glass may include the same material as the glass substrate.

The glass frame and the cover glass may include the same material as the glass substrate.

The semiconductor device may further include a light shielding film provided on partial portions of surfaces of the glass frame and the cover glass.

The semiconductor device may further include a light shielding film provided on partial portions of surfaces of the glass frame and the cover glass.

MODE FOR CARRYING OUT THE INVENTION

Hereinafter, specific embodiments to which the present technology is applied will be described in detail with reference to the drawings. The drawings are schematic or conceptual, and a ratio of each portion and the like are not necessarily the same as the actual ones. In the specification and the drawings, an element similar to that previously described with respect to a preceding drawing will be denoted by the same reference sign, and the detailed description thereof will be appropriately omitted.

First Embodiment

Figure 1:
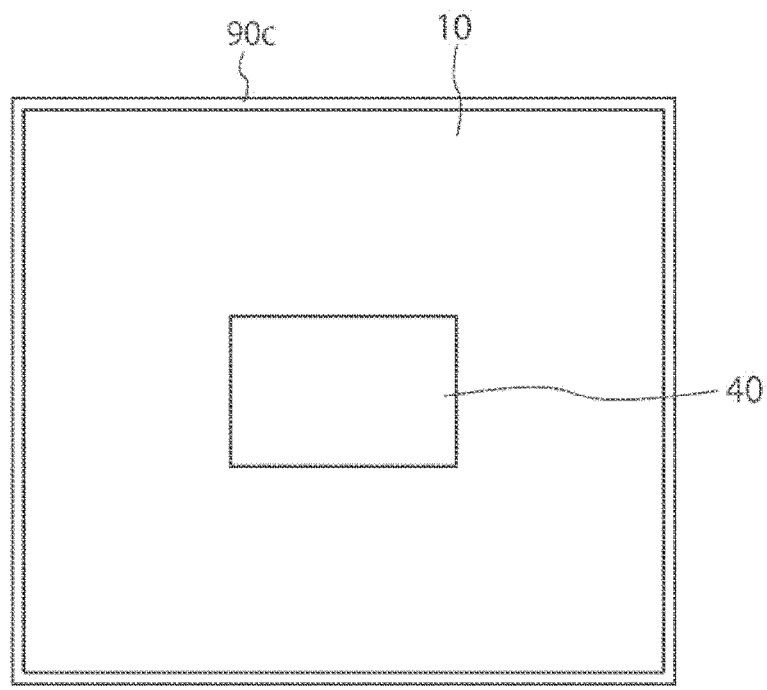
FIG. 1 is a schematic plan view illustrating a configuration example of a semiconductor device according to a first embodiment.
Figure 2:
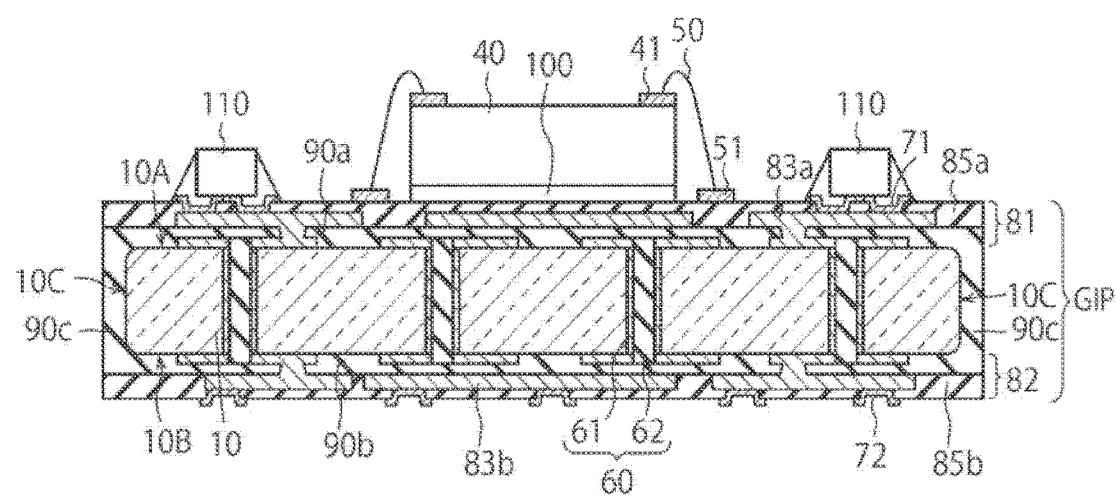
FIG. 2 is a schematic cross-sectional view illustrating a configuration example of the semiconductor device according to the first embodiment.

FIG. 1 is a schematic plan view illustrating a configuration example of a semiconductor device (hereinafter also referred to as a package or a module) according to a first embodiment. FIG. 2 is a schematic cross-sectional view illustrating a configuration example of the semiconductor device according to the first embodiment. Note that, in FIG. 1, while a positional relationship between a glass substrate 10, an insulating film 90c, and a semiconductor chip 40 is illustrated, a detailed configuration of a through electrode, etc. are not illustrated.

As illustrated in FIG. 1, the semiconductor chip 40 is mounted on a central portion of the glass substrate 10. The insulating film 90c is provided around the glass substrate 10 to continuously cover an entire side surface of the glass substrate 10. The semiconductor chip 40 is not particularly limited, but may be, for example, a CMOS image sensor chip.

As illustrated in FIG. 2, the glass substrate 10 has a first surface 10A, a second surface 10B opposite to the first surface, and a side surface (a first side surface) 10C between the first surface 10A and the second surface 10B. A laminated wiring part 81 is provided on the first surface 10A. The laminated wiring part 81 includes a plurality of layers of wiring 83a provided on the first surface 10A. The wiring 83a is covered with insulating films 85a and 90a. A laminated wiring part 82 includes a plurality of layers of wiring 83b provided on the second surface 10B. The wiring 83b is covered with insulating films 85b and 90b. For the wirings 83a and 83b, for example, a low-resistance metal material such as copper is used.

A partial portion of the wiring 83a is electrically connected to an electrode pad 71 on the first surface 10A. A partial portion of the wiring 83b is electrically connected to an electrode pad 72 on the second surface 10B. The electrode pads 71 and 72 are connected to an electronic components 110 or the like, or connected to other substrates and components (not illustrated).

In addition, another part of the wiring 83a is electrically connected to a bonding pad 51, and is electrically connected to the semiconductor chip 40 via the bonding pad 51 and a bonding wire 50.

A partial portion of the wiring 83a is provided on the first surface 10A of the glass substrate 10 to be in direct contact with the glass substrate 10, and the insulating film 90a is provided to cover a partial portion of the wiring 83a. The insulating film 90a as a first insulating film covers the first surface 10A and the wiring 83a, and a partial portion thereof is in contact with the first surface 10A and the other partial portion thereof is in contact with the wiring 83a.

The wiring 83a directly contacting the glass substrate 10 can be used as an alignment mark in a subsequent step. In this case, it is not necessary to use an outer edge of the glass substrate 10 as an alignment mark. As a result, the patterning of the laminated wiring parts 81 and 82 or the mounting of the semiconductor chip 40 can be performed with higher accuracy.

A partial portion of the wiring 83b is provided on the second surface 10B of the glass substrate 10 to be in direct contact with the glass substrate 10, and the insulating film 90b is provided to cover a partial portion of the wiring 83b. The insulating film 90b as a second insulating film covers the second surface 10B and the wiring 83b, and a partial portion thereof is in contact with the second surface 10B and the other partial portion thereof is in contact with the wiring 83b.

The insulating film 90c is provided on the side surface 10C of the glass substrate 10. As illustrated in FIG. 1, the insulating film 90c as a third insulating film is provided on an entire outer periphery of the glass substrate 10. Furthermore, as illustrated in FIG. 2, the insulating film 90c is provided to cover the entire side surface 10C from the first surface 10A to the second surface 10B. The insulating film 90c is continuous with and seamlessly connected to at least one of the insulating films 90a and 90b. Alternatively, the insulating films 90a to 90c may be continuously and seamlessly connected to each other on all of the first surface 10A, the second surface 10B, and the first side surface 10C. The insulating films 90a to 90c include the same material, for example, using an insulating resin material such as an epoxy resin.

As described above, the insulating film 90c covers the side surface 10C of the glass substrate 10, and is continuously connected to at least one of the insulating films 90a and 90b to protect the first surface 10A or the second surface 10B of the glass substrate 10. As a result, the insulating films 90a to 90c can protect the end portion and the side surface 10C of the glass substrate 10.

The side surface 10C of the glass substrate 10 is substantially flat. The insulating film 90c is also substantially flat. As a result, the insulating film 90c has a substantially uniform thickness, thereby making it possible to suppress concentration of stress on the glass substrate 10.

A through electrode 60 is provided in the glass substrate 10. The through electrode 60 includes a metal film 61 covering an inner wall of a through hole (a through glass via (TGV)) penetrating through the glass substrate 10 between the first surface 10A and the second surface 10B thereof, and an insulating film 62 filled inside the metal film 61. For the metal film 61, for example, a low-resistance metal material such as copper is used. It is preferable that the metal film 61 is continuously connected to the wirings 83a and 83b, and includes the same material as the wirings 83a and 83b. The metal film 61 is provided to electrically connect a partial portion of the wiring 83 and a partial portion of the wiring 84 to each other through a via. It is preferable that the insulating film 62 as a fourth insulating film is continuously connected to the insulating films 90a and 90b, and includes the same material as the insulating films 90a to 90c. That is, for example, an insulating material such as an epoxy resin is used for the insulating film 62. As a result, the insulating films 90a to 90c and 62 can be simultaneously formed in the same process, and can be formed as a seamlessly continuous insulating film. The inner wall of the via and peripheries of opening ends of the via are seamlessly covered with the wiring layers 83a and 83b and the metal film 61, and furthermore, the insulating films 90a to 90c and 62 are seamlessly and continuously filled from the inside to the outside of the via. As a result, stress generated on a processed surface for forming a TGV is reduced and the TGV is reinforced. Therefore, the strength of the TGV can be improved.

The wiring 83a and the insulating film 85a are also provided on the insulating film 90a of the first surface 10A of the glass substrate 10. In this way, the laminated wiring part 81 has a multilayer wiring structure. The wiring 83b and the insulating film 85b are also provided on the insulating film 90b of the second surface 10B of the glass substrate 10. In this way, the laminated wiring part 82 also has a multilayer wiring structure. The electrode pad 71 and the bonding pad 51 are connected to the wiring 83a, and the electrode pad 72 or a bonding pad (not illustrated) is connected to the wiring 83b.

The semiconductor chip 40 and the electronic component 110 are mounted on the glass substrate 10. A bonding pad 41 of the semiconductor chip 40 is connected to the bonding pad 51 via the bonding wire 50. The electronic component 110 is connected to the electrode pad 71. The semiconductor chip 40 is bonded onto the insulating film 85a by an adhesive 100.

Note that, in the present embodiment, the semiconductor device may be configured as a glass interposer (hereinafter also simply referred to as GIP) on which the semiconductor chip 40 and the electronic component 110 are not yet mounted.

According to the present embodiment, the insulating film 90c covers the side surface 10C of the glass substrate 10, and is continuously connected to at least one of the insulating film 90a on the first surface 10A and the insulating film 90b on the second surface 10B of the glass substrate 10. As a result, the insulating films 90a to 90c can protect the end portion and the side surface 10C of the glass substrate 10.

In the present embodiment, the laminated wiring part 81 and the laminated wiring part 82 are layered in the same manner, and have the same number of wiring layers and the same number of insulating layers. Furthermore, it is preferable that a thickness of each wiring layer and a thickness of each insulating layer are substantially equal between the laminated wiring part 81 and the laminated wiring part 82. Therefore, the laminated wiring part 81 and the laminated wiring part 82 have substantially symmetrical configurations, and apply substantially the same stress to the glass substrate 10. As a result, the distortion of the glass substrate 10 can be suppressed. Note that the laminated wiring part 81 and the laminated wiring part 82 may be different from each other in wiring pattern.

(Modification)

Figure 3:
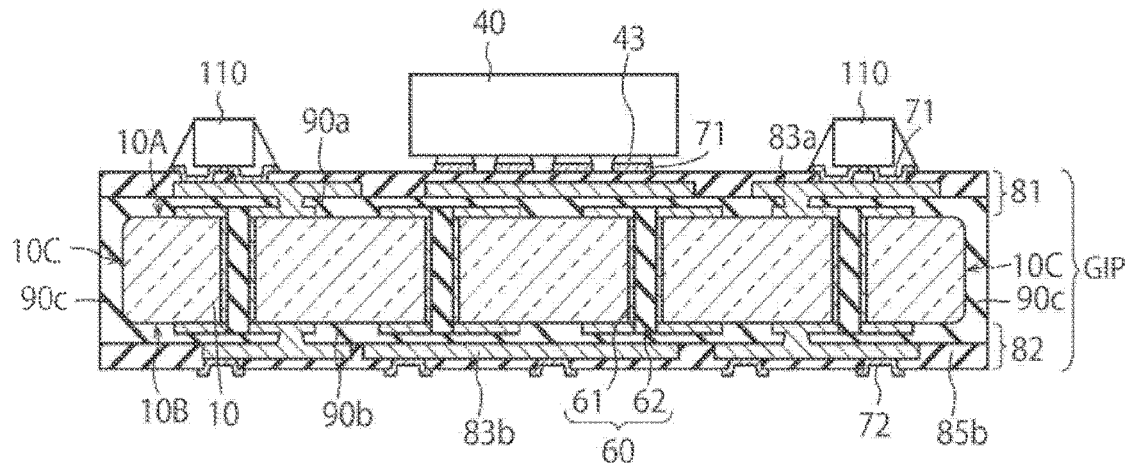
FIG. 3 is a schematic cross-sectional view illustrating a configuration example of a semiconductor device according to a modification of the first embodiment.

FIG. 3 is a schematic cross-sectional view illustrating a configuration example of a semiconductor device according to a modification of the first embodiment. In the present modification, the semiconductor chip 40 is flip-chip connected to the substrate for the semiconductor device. The semiconductor chip 40 includes a metal bump 43, and is connected to the laminated wiring part 81 by the metal bump 43. That is, in the present modification, the semiconductor chip 40 located above the glass substrate 10 is connected to the glass substrate 10 in a flip-chip type. The other configurations in the present modification may be similar to the corresponding configurations in the first embodiment. Therefore, the present modification can obtain the same effects as the first embodiment.

Second Embodiment

Figure 4:
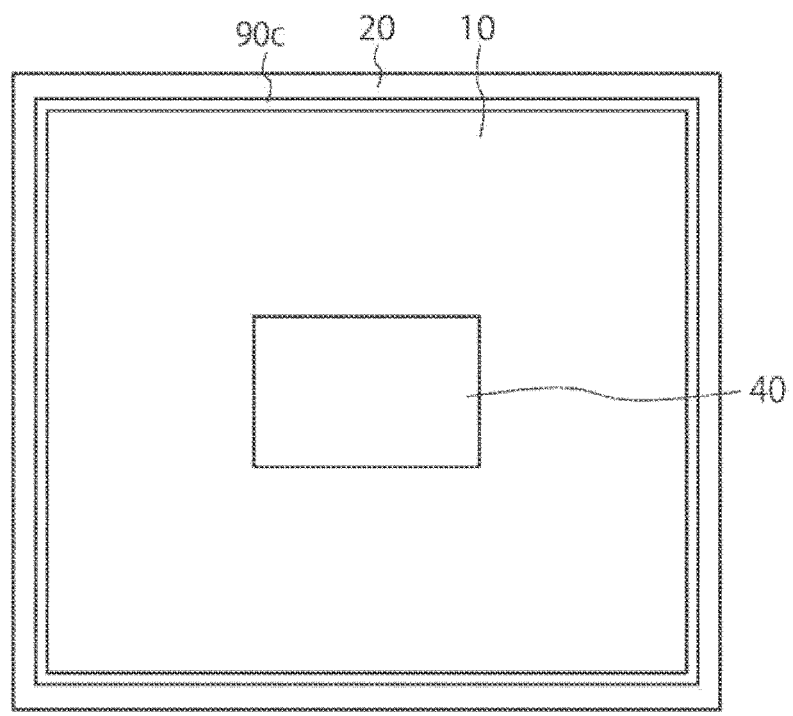
FIG. 4 is a schematic plan view illustrating a configuration example of a GIP according to a second embodiment.

FIG. 4 is a schematic plan view illustrating a configuration example of a GIP according to a second embodiment.

Figure 5:
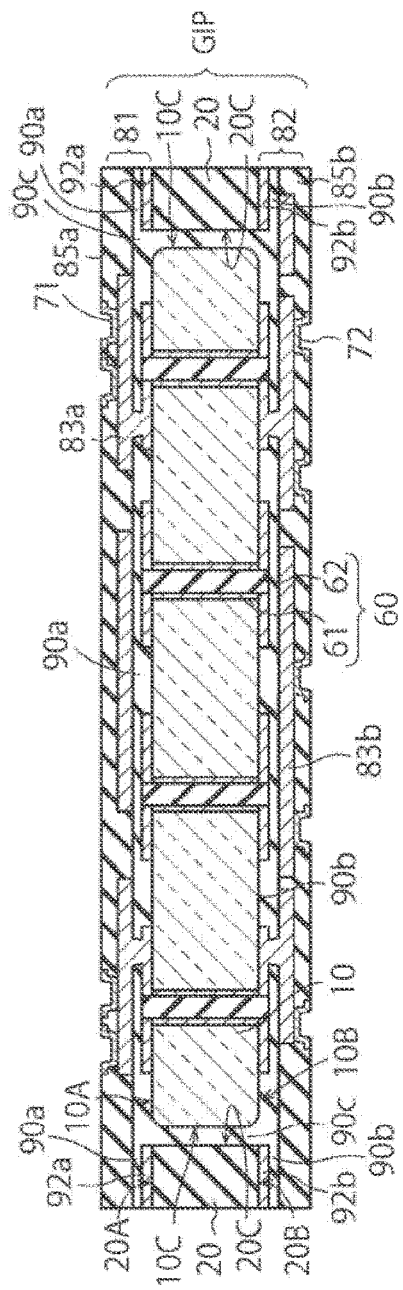
FIG. 5 is a schematic cross-sectional view illustrating a configuration example of the GIP according to the second embodiment.

FIG. 5 is a schematic cross-sectional view illustrating a configuration example of the GIP according to the second embodiment. The GIP according to the second embodiment may be applied to any of the first embodiment and the modification thereof.

The GIP according to the second embodiment further includes a frame 20 outside the insulating film 90c on the side surface 10C of the glass substrate 10. As illustrated in FIG. 4, the frame 20 is a frame-shaped member provided to face the entire side surface 10C around the outer periphery of the glass substrate 10.

As illustrated in FIG. 5, the frame 20 is bonded onto the side surface 10C of the glass substrate 10 by the insulating film 90c. The frame 20 has a third surface 20A, a fourth surface 20B, and a side surface (a second side surface) 20C between the third surface 20A and the fourth surface 20B. The side surface 20C is an inner side surface of the frame 20 and is a surface facing the side surface 10C. The side surface 20C of the frame 20 is bonded onto the insulating film 90c. The frame 20 is provided to surround the entire outer edge of the glass substrate 10 to protect the side surface 10C of the glass substrate 10 together with the insulating film 90c.

The third surface 20A of the frame 20 is a frame surface located on the same side as the first surface 10A of the glass substrate 10. The fourth surface 20B of the frame 20 is a frame surface located on the same side as the second surface 10B of the glass substrate 10. The insulating film 90c is provided between the side surface 10C of the glass substrate 10 and the side surface 20C of the frame 20. The frame 20 includes a material having a linear expansion coefficient close to that of the glass substrate 10. For the frame 20, for example, an insulating resin material such as a glass epoxy resin is used. By making the linear expansion coefficients of the frame 20 and the glass substrate 10 close to each other, stress applied to the glass substrate 10 can be suppressed. It is preferable that the linear expansion coefficient of the frame 20 is substantially equal to the linear expansion coefficient of the glass substrate 10.

A first metal film 92a and a second metal film 92b are formed on the third surface 20A and the fourth surface 20B of the frame 20, respectively. Each of the metal films 92a and 92b is formed by depositing a metal film on the surface of the frame 20 using a plating technique and then patterning the metal film using a lithography technique or the like.

Moreover, the insulating films 90a and 85a and the insulating films 90b and 85b are provided on the metal films 92a and 92b, respectively. The insulating film 90a is continuously provided from on the first surface 10A of the glass substrate 10 to on the metal film 92a. The insulating film 90b is continuously provided from on the second surface 10B of the glass substrate 10 to on the metal film 92b. The insulating film 85a is provided on the insulating film 90a, and is continuously provided from above the first surface 10A of the glass substrate 10 to above the metal film 92a. The insulating film 85b is provided on the insulating film 90b, and is continuously provided from above the second surface 10B of the glass substrate 10 to above the metal film 92b.

The other configurations in the second embodiment may be similar to the corresponding configurations in the first embodiment. Therefore, the second embodiment can obtain the same effects as the first embodiment. In the second embodiment, the frame 20 is provided outside the insulating film 90c along the side surface 10C of the glass substrate 10. As a result, in the second embodiment, the end portions and the side surface 10C of the glass substrate 10 can be more reliably protected.

Moreover, in a case where the GIP is used for a CMOS image sensor, the frame 20 covering the side surface 10C making it possible to block stray light.

Third Embodiment

Figure 6:
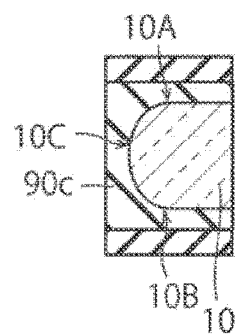
FIG. 6 is a schematic cross-sectional view illustrating a configuration example of one end of a GIP according to a third embodiment.

FIG. 6 is a schematic cross-sectional view illustrating a configuration example of one end of a GIP according to a third embodiment. In the third embodiment, in a cross section in a direction perpendicular to the first surface 10A, the side surface 10C of the glass substrate 10 has a curved shape to protrude outward. This is because dicing is performed using laser and wet etching when the GIP is divided into individual pieces. The glass substrate 10 is irradiated with short pulse laser in a thickness direction thereof for reformation, and wet etching is performed. The reformed portion is selectively etched. Due to a difference in duration of exposure to an etching solution, the glass substrate 10 is formed such that the corners of the side surface 10C are rounded, and the side surface 10C has a curved shape to protrude outward. As a result, it is possible to suppress a fracture or a crack in the end portion of the glass substrate 10, or concentration of stress and microcracks that cause the brokenness.

Figure 7:
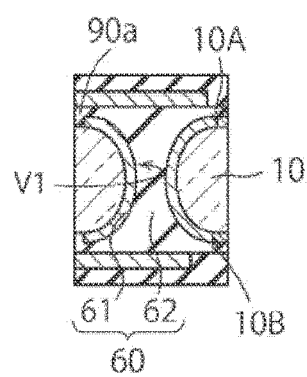
FIG. 7 is a schematic cross-sectional view illustrating a configuration example of a through electrode of the GIP according to the third embodiment.

FIG. 7 is a schematic cross-sectional view illustrating a configuration example of a through electrode of the GIP according to the third embodiment. As illustrated in FIG. 7, an inner side surface of a via V1 of the through electrode 60 may also have a curved shape similarly to the side surface 10C. In a case where the via V1 of the through electrode 60 is formed by laser and wet etching similarly to what are performed during the dicing process, the inner surface of the via V1 has a curved shape to protrude inward of the via V1 in the cross section in the direction perpendicular to the first surface 10A. That is, the via V1 provided in the glass substrate 10 is formed such that the corners thereof are rounded, and the via has a curved shape to protrude outward of the glass substrate 10 when viewed from the glass substrate 10. As a result, it is possible to further suppress a fracture or a crack in the end portion of the glass substrate 10 in the through electrode 60.

When the dicing of the glass substrate 10 and the forming of the via V1 of the through electrode 60 are executed under the same conditions, a curvature of the inner side surface of the through electrode 60, which is a curved surface, is substantially equal to a curvature of the side surface 10C, which is a curved surface. That is, the inner side surface of the through electrode 60 has substantially the same cross-sectional shape as the side surface 10C. In this case, it is not necessary to separately prepare recipes for the dicing process and the via formation process, and the process can be simplified.

FIGS. 8 to 15 are schematic cross-sectional views illustrating an example of a method for manufacturing the GIP according to the first embodiment.

First, a glass substrate 10 is prepared. The glass substrate 10 has a first surface 10A and a second surface 10B. The glass substrate 10 has not yet been diced, and does not have a first side surface 10C in this step. That is, the glass substrate 10 is in a glass panel state in this step.

Figure 8:
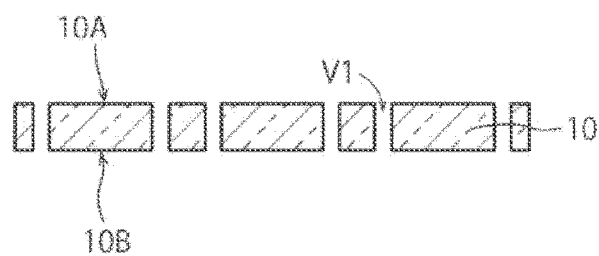
FIG. 8 is a schematic cross-sectional view illustrating an example of a method for manufacturing a GIP according to the first embodiment.

Next, as illustrated in FIG. 8, a via V1 penetrating through the glass substrate 10 between the first surface 10A and the second surface 10B is formed as a through hole (TGV). The via V1 is formed at the same position as the through electrode 60. The via V1 is formed, for example, using a laser processing technique and an etching technique. A sequence of reforming points arranged in the thickness direction of the glass substrate 10 are formed with laser light, and thereafter, the glass substrate 10 is partially etched using wet etching. As a result, as described with reference to FIG. 7, an inner side surface of the via V1 is rounded to have a curved shape, thereby making it possible to suppress a fracture or a crack in the end portion of the through electrode 60.

Figure 9:
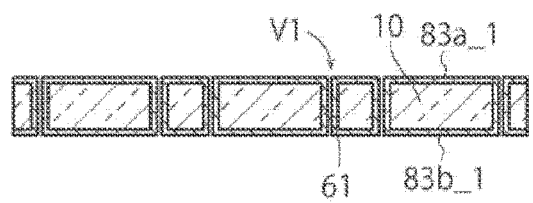
FIG. 9 is a schematic cross-sectional view illustrating the method for manufacturing the GIP, following FIG. 8.

Next, as illustrated in FIG. 9, metal films are formed on the first surface 10A, the second surface 10B, and an inner wall surface of the via V1. The metal films include, for example, a low resistance metal such as copper, and is formed by plating. As a result, a metal film 83a_1 is formed on the first surface 10A as a lower layer of the wiring 83a, and a metal film 83b_1 is formed on the second surface 10B as a lower layer of the wiring 83b. Furthermore, a metal film 61 is formed on the inner wall surface of the via V1. The wirings 83a and 83b and the metal film 61 are in direct contact with the surfaces of the glass substrate 10.

Figure 10:
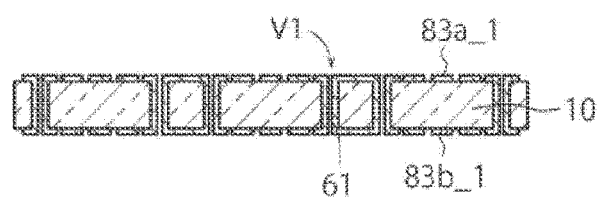
FIG. 10 is a schematic cross-sectional view illustrating the method for manufacturing the GIP, following FIG. 9.

Next, as illustrated in FIG. 10, the metal films 83a_1 and 83b_1 are processed to have a predetermined wiring pattern. For example, the metal films 83a_1 and 83b_1 may be patterned using a laser processing technique. Alternatively, the metal films 83a_1 and 83b_1 may be patterned using a lithography technique and an etching technique. At this time, the wiring 83a directly contacting the first surface 10A of the glass substrate 10 can be used as an alignment mark. In this way, the patterning of the laminated wiring parts 81 and 82 can be performed with higher accuracy.

Figure 11:
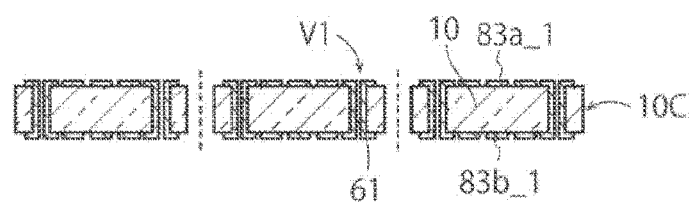
FIG. 11 is a schematic cross-sectional view illustrating the method for manufacturing the GIP, following FIG. 10.

Next, as illustrated in FIG. 11, the glass substrate 10 in the form of a glass plate is diced to be divided into individual pieces that are suitable for individual semiconductor devices. Similarly to what are performed when the via V1 is formed, the dicing process may be performed, for example, using a laser processing technique and an etching technique. The glass substrate 10 is diced with laser light, and thereafter, the glass substrate 10 is partially etched using wet etching. In this way, as described with reference to FIG. 6, the side surface 10C of the glass substrate 10 has a curved shape to protrude outward. As a result, it is possible to suppress a fracture or a crack in the end portion of the glass substrate 10.

Figure 12:
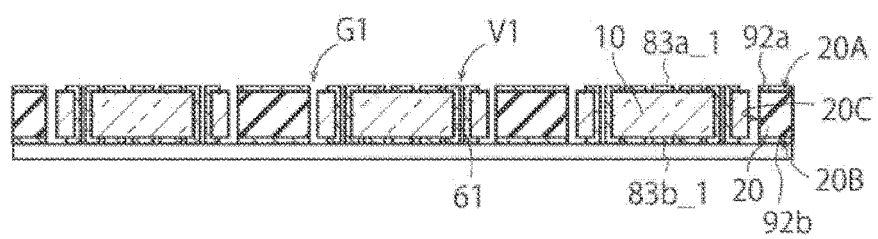
FIG. 12 is a schematic cross-sectional view illustrating the method for manufacturing the GIP, following FIG. 11.

Next, as illustrated in FIG. 12, the individual pieces of the divided glass substrate 10 are disposed in a frame 20 on a support substrate. Metal films 92a and 92b are provided in advance on a third surface 20A and a fourth surface 30B of the frame 20. The frame 20 is formed in a mesh shape, and the individual pieces of the glass substrate 10 are placed on an inner side of the mesh. The inner side surface 20C of the frame 20 faces the side surface 10C of the glass substrate 10, and a gap G1 is provided between the inner side surface 20C of the frame 20 and the side surface 10C of the glass substrate 10. The gap G1 only needs to have a width capable of absorbing stress generated due to a deformation difference between an individual piece of the glass substrate 10 and the frame 20 while allowing a material for forming an insulating film 90c to flow thereinto, and is preferably as narrow as possible in order to reduce a package size of the semiconductor device.

Figure 13:
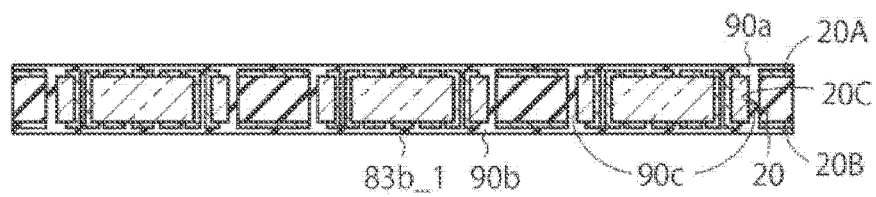
FIG. 13 is a schematic cross-sectional view illustrating the method for manufacturing the GIP, following FIG. 12.

Next, as illustrated in FIG. 13, a resin material is laminated on the first surface 10A of the glass substrate 10 and the third surface 20A of the frame 20. In this case, the resin material is in the form of a film, and is flowable when heated. Accordingly, the resin material flows into the via V1, and also flows into the gap G1 between the side surface 20C of the frame 20 and the side surface 10C of the glass substrate 10. In this way, an insulating film 90a is formed on the first surface 10A, an insulating film 62 is filled inside the metal film 61 in the via V1, and an insulating film 90c is filled in the gap G1. After flowing into the via V1 and the gap G1, the resin material is preliminary cured by heat treatment. The insulating film 90a covers the metal film 83a_1 on the first surface 10A to protect the metal film 83a_1. Furthermore, the insulating film 90c is filled in the gap G1 to fix the frame 20 to the glass substrate 10. The insulating film 62 is filled in the via V1 to protect the metal film 61. The metal film 61 and the insulating film 62 constitute a through electrode 60 in the via V1.

Note that, in order to embed the resin material in the via V1 simultaneously with the formation of the insulating film 90a, the metal film 83a_1 is not provided above the opening of the via V1 such that the via V1 is open. This is to prevent the metal film 83a_1 from blocking the opening of the via V1 to allow the resin material to flow into the via V1. By filling the insulating film 90c and the insulating film 62 in the via V1, it is possible to increase the strength of the glass substrate 10 in the vicinity of the via V1.

Also, the metal film 83b_1 is not provided below the opening of the via V1 such that the via V1 is open. This is to prevent the metal film 83b_1 from blocking the opening of the via V1 on the second surface 10B side to allow the resin material to flow into the via V1 from the second surface 10B side. As a result, it is possible to increase the strength of the glass substrate 10 in the vicinity of the via V1. Therefore, in order to allow the resin material to flow into the via V1, the metal films 83a_1 and 83b_1 are not provided above and below the opening of the via V1.

Furthermore, the insulating films 90a, 90c, and 62 are formed by the same process using the same resin material (e.g., an epoxy resin). Therefore, the insulating films 90a, 90c, and 62 can be formed as a seamlessly continuous insulating film. As a result, the insulating films 90a, 90c, and 62 and the frame 20 can reliably protect the glass substrate 10.

Moreover, the resin material is also laminated from the second surface 10B side of the glass substrate 10. It is preferable that the resin material is sufficiently filled in the via V1 and the gap G1 from the first surface 10A. In this case, it is only necessary to laminate the resin material on the second surface 10B. Thereafter, the resin material is preliminary cured. In this say, an insulating film 90b is formed on the second surface 10B. The insulating film 90b is individually formed after the insulating films 90a, 90c, and 62 are formed. At this point of time, the insulating film 90b and the insulating films 90a, 90c, and 62 are in the preliminary cured state. Thereafter, the insulating films are further heated to be fully cured. The insulating film 90b and the insulating films 90a, 90c, and 62 include the same material, and are melted at joint portions in a process where the insulating films are fully cured, such that they can be formed almost seamlessly and continuously. As a result, the end portion of the glass substrate 10 can be protected, and the stress applied to the glass substrate 10 is also reduced. In addition, the insulating films 90a and 90b are hardly peeled off from the glass substrate 10.

Note that, as long as the insulating film 90b and the insulating film 90a, 90c, or 62 are sufficiently in close contact with each other, the effect of the present embodiment is not lost on the ground that there is a link therebetween. That is, if the insulating film 90c is continuously connected to at least one of the insulating films 90a and 90b, at least one end of the glass substrate 10 can be protected, thereby protecting the glass substrate 10 from stress.

Figure 14:
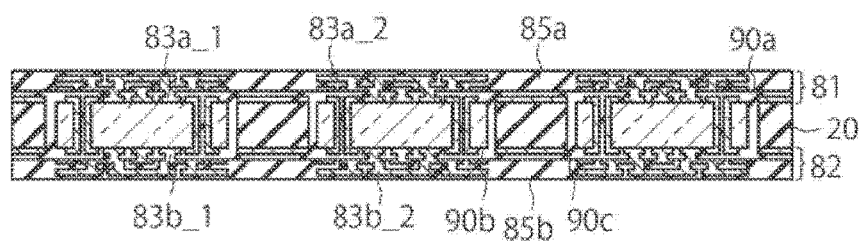
FIG. 14 is a schematic cross-sectional view illustrating the method for manufacturing the GIP, following FIG. 13.

Next, as illustrated in FIG. 14, the insulating films 90a and 90b are processed to have a predetermined pattern such that the metal films 83a_1 and 83b_1 are partially exposed. For example, the insulating films 90a and 90b may be processed to form vias using a laser processing technique. Alternatively, the insulating films 90a and 90b may be patterned using a lithography technique and an etching technique.

Next, a metal film 83a_2 is patterned after being deposited on the insulating film 90a and the metal film 83a_1 as an upper layer of the wiring 83a. In addition, an insulating film 85a is patterned after being deposited on the metal film 83a_2. In this way, the laminated wiring part 81 is formed by repeating the depositing and processing of the metal film 83a_2 and the insulating film 85a.

The similar process is executed for the second surface 10B. That is, a metal film 83b_2 is patterned after being deposited on the insulating film 90b and the metal film 83b_1 as an upper layer of the wiring 83b. In addition, an insulating film 85b is patterned after being deposited on the metal film 83b_2. In this way, the laminated wiring part 82 is formed by repeating the depositing and processing of the metal film 83b_2 and the insulating film 85b.

By doing so, the structure illustrated in FIG. 14 is obtained. It is preferable that the metal films 83a_1 and 83a_2 and the insulating films 90a and 85a on the first surface 10A side of the glass substrate 10 are substantially identical to the metal films 83b_1 and 83b_2 and the insulating films 90b and 85b on the second surface 10B side of the glass substrate 10, in terms of the number of layers, a film thickness, and a material. As a result, stress applied to the glass substrate 10 can be substantially uniform from the laminated wiring parts 81 and 82, thereby suppressing the distortion of the glass substrate 10.

Figure 15:
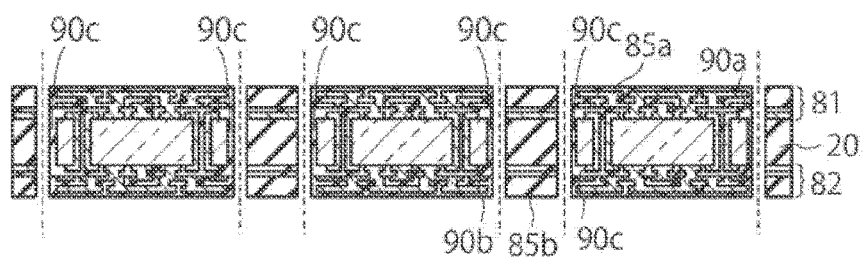
FIG. 15 is a schematic cross-sectional view illustrating the method for manufacturing the GIP, following FIG. 14.

Next, as illustrated in FIG. 15, the GIP including the glass substrate 10 is diced into individual pieces between the frame 20 and the insulating film 90c. The dicing process may be performed using a laser processing technique or a dicing blade. In the present embodiment, the dicing process is performed between the side surface 20c of the frame 20 and the side surface 10C of the glass substrate 10. As a result, while the insulating film 90c remains on the side surface of the glass substrate 10, the frame 20 is not left. In this way, the GIP illustrated in FIG. 2 or 3 can be formed.

Thereafter, as illustrated in FIG. 2, the semiconductor chip 40 is bonded onto the insulating film 85a, and the bonding wire 50 is connected between the bonding pad 41 of the semiconductor chip 40 and the bonding pad 51 of the laminated wiring part 81. Further, the electronic component 110 is connected to the electrode pad 71. As a result, the structure illustrated in FIG. 2 is obtained.

Alternatively, as illustrated in FIG. 3, the semiconductor chip 40 may be connected onto the GIP in a flip-chip type. The semiconductor chip 40 includes a metal bump 43, and is connected to the laminated wiring part 81 by the metal bump 43. In this way, the semiconductor chip 40 located above the glass substrate 10 may be connected to the glass substrate 10 in a flip-chip type. As a result, the structure illustrated in FIG. 3 is obtained.

Thereafter, a CMOS image sensor module or the like can be formed through a further assembling process.

Figure 16:
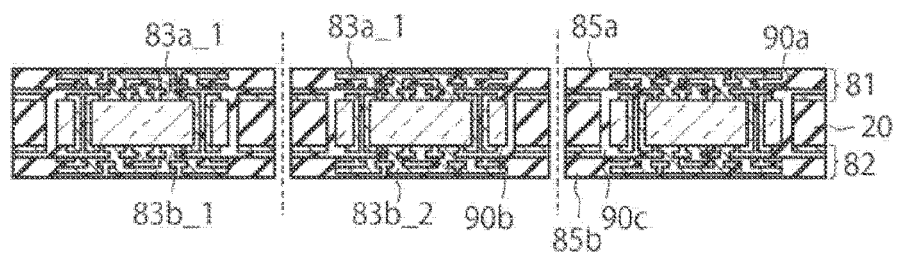
FIG. 16 is a cross-sectional view illustrating an example of a method for manufacturing the GIP according to the second embodiment.

FIG. 16 is a cross-sectional view illustrating an example of a method for manufacturing the GIP according to the second embodiment. In the second embodiment, after the steps of FIGS. 8 to 14, the frame 20 is diced as illustrated in FIG. 16. As a result, the glass substrate 10 including the insulating film 90c and the frame 20 is divided into individual pieces. The dicing process may be performed using a laser processing technique or a dicing blade. The dicing process is performed along a center line of the frame 20 or both sides thereof. Therefore, the insulating film 90c and the frame 20 are left on the side surface of the glass substrate 10. As a result, the GIP illustrated in FIG. 5 can be formed.

Thereafter, the semiconductor chip 40 is bonded onto the insulating film 85a, and the bonding wire 50 is connected between the bonding pad 41 of the semiconductor chip 40 and the bonding pad 51 of the laminated wiring part 81. Alternatively, the semiconductor chip 40 may be connected onto the GIP in a flip-chip type.

Thereafter, a CMOS image sensor module or the like can be formed through a further assembling process.

According to the present embodiment, the glass substrate 10 in the plate state is divided into individual pieces before the insulating films 90a to 90c, 85a, and 85b are deposited on the glass substrate 10. As a result, the stress caused due to the shrinkage of the insulating films 90a to 90c, 85a, and 85b when cured is dispersed. Moreover, by covering the surfaces 10A to 10C of the glass substrate 10 with the insulating films 90a to 90c, 85a, and 85b after being divided into an individual piece, the stress generated on the side surface 10C can be reduced. As a result, a crack in the glass substrate 10 can be suppressed. Note that, in a simulation, stress on the glass substrate 10 of the GIP manufactured according to the first embodiment was about half of stress on the glass substrate divided into individual pieces after the laminated wiring parts 81 and 82 are formed. In addition, stress of the glass substrate 10 of the GIP including the frame 20 manufactured according to the second embodiment was about ⅕ of stress on the glass substrate divided into individual pieces after the laminated wiring parts 81 and 82 are formed.

Fourth Embodiment

Figure 17:
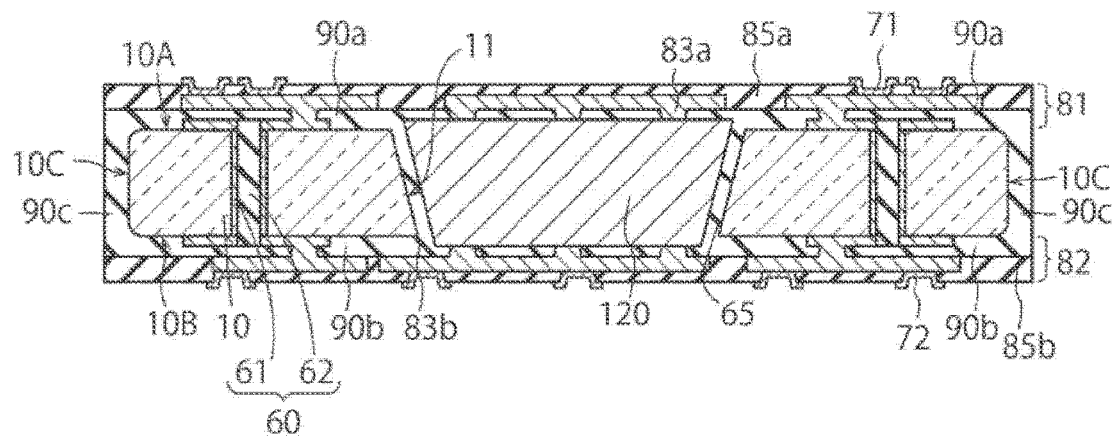
FIG. 17 is a cross-sectional view illustrating a configuration example of a GIP according to a fourth embodiment.

FIG. 17 is a cross-sectional view illustrating a configuration example of a GIP according to a fourth embodiment. The GIP according to the fourth embodiment has an opening 11 in a central portion of the glass substrate 10. The opening 11 is provided in the central portion of the glass substrate 10 between the first surface 10A and the second surface 10B, and has a taper on an inner side surface thereof. A metal plate 120 is inserted into the opening 11. The metal plate 120 is provided to face a back surface of the semiconductor chip 40 to absorb heat generated in the semiconductor chip 40 and release the heat from the second surface 10B of the glass substrate 10. That is, the metal plate 120 functions as a heat dissipation plate of the semiconductor chip 40. For the metal plate 120, for example, a material having high thermal conductivity such as copper or silicon is used. The metal plate 120 has a taper on a side surface thereof at an inclination substantially equal to that of the inner side surface of the opening 11 to follow the inner side surface of the opening 11.

An insulating film 65 is provided between the side surface of the metal plate 120 and the inner side surface of the opening 11. Similarly to the insulating films 62 and 90c, the insulating film 65 is formed by filling a resin material between the side surface of the metal plate 120 and the inner surface of the opening 11 simultaneously with the formation of the insulating film 90a. Therefore, the insulating film 65 extends along the side surface of the metal plate 120 and the inner side surface of the opening 11 in a direction to be inclined with respect to the first and second surfaces 10A and 10B.

The insulating film 65 includes the same material as the insulating films 90a, 90c, and 62, and is continuously and seamlessly connected to the insulating films 90a, 90c, and 62. As a result, the insulating film 65 can sufficiently protect an end portion of the opening 11 of the glass substrate 10. The insulating film 65 may include the same material as the insulating film 90b, and be continuously and seamlessly connected to the insulating film 90b. As a result, the insulating film 65 can more reliably protect the end portion of the opening 11 of the glass substrate 10. Furthermore, stress on the glass substrate 10 is also reduced.

Figure 18:
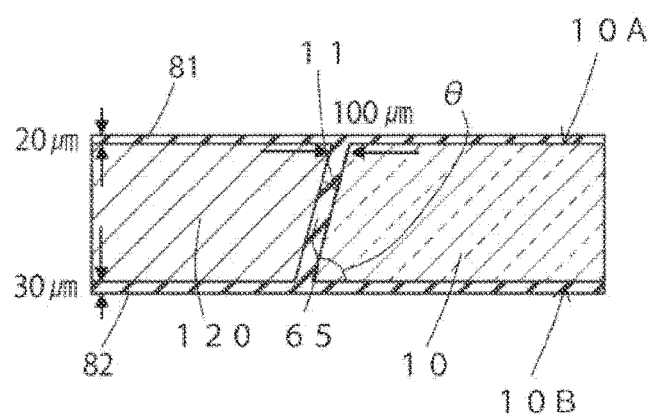
FIG. 18 is a cross-sectional view illustrating an example of a boundary between an opening and a metal plate.
Figure 19:
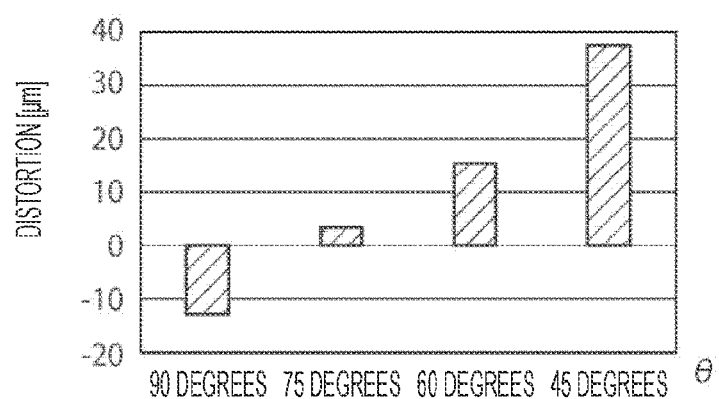
FIG. 19 is a graph showing a result of measuring a distortion of a glass substrate shown in FIG. 18.

The fourth embodiment is effective in a case where the first surface 10A and the second surface 10B are different in stress applied to the glass substrate 10 therefrom due to a difference between the laminated wiring parts 81 and 82 in film thickness, the number of layers, material, etc. For example, FIG. 18 is a cross-sectional view illustrating an example of a boundary between the opening 11 and the metal plate 120. It is assumed that the laminated wiring part 81 is 20 μm, the laminated wiring part 82 is 30 μm, and the insulating film 65 is 100 μm. It is also assumed that the laminated wiring parts 81 and 82 include the same pattern of metal films and the same pattern of insulating films at the same thickness. As a result of simulating the warpage of the glass substrate 10 at room temperature, the result illustrated in FIG. 19 was obtained. FIG. 19 is a graph showing a result of analyzing the warpage of the glass substrate 10 shown in FIG. 18. An inclination angle θ of the taper is an inclination angle of the inner wall surface of the opening 11 toward the glass substrate 10 with respect to the second surface 10B having the relatively thick laminated wiring part 82 thereon. When θ=90 degrees, the inclination angle corresponds to a direction perpendicular to the second surface 10B (and the first surface 10A), and when θ=0 degrees, the inclination angle corresponds to a direction parallel to the second surface 10B (and the first surface 10A). According to this graph, the warpage is minimized when the inclination angle θ is about 75 degrees. That is, when the inclination angle θ of the taper of each of the opening 11 and the metal plate 120 is set to about 75 degrees, the warpage applied to the glass substrate 10 is minimized.

As described above, in the fourth embodiment, the side surface of the metal plate 120 and the inner side surface of the opening 11 have a tapered shape, and the insulating film 65 is filled following the tapered shape. As a result, warpage occurring on the glass substrate 10 can be controlled and reduced.

The other configurations in the fourth embodiment may be similar to the corresponding configurations in the first embodiment. Therefore, the fourth embodiment can obtain the same effects as the first embodiment. Furthermore, the fourth embodiment may be applied to either the second or third embodiment.

In the above-described embodiment, partial portions of the laminated wiring parts 81 and 82 or the metal films 92a and 92b may be used as antennas for wireless communication.

First Application Example

Figure 20:
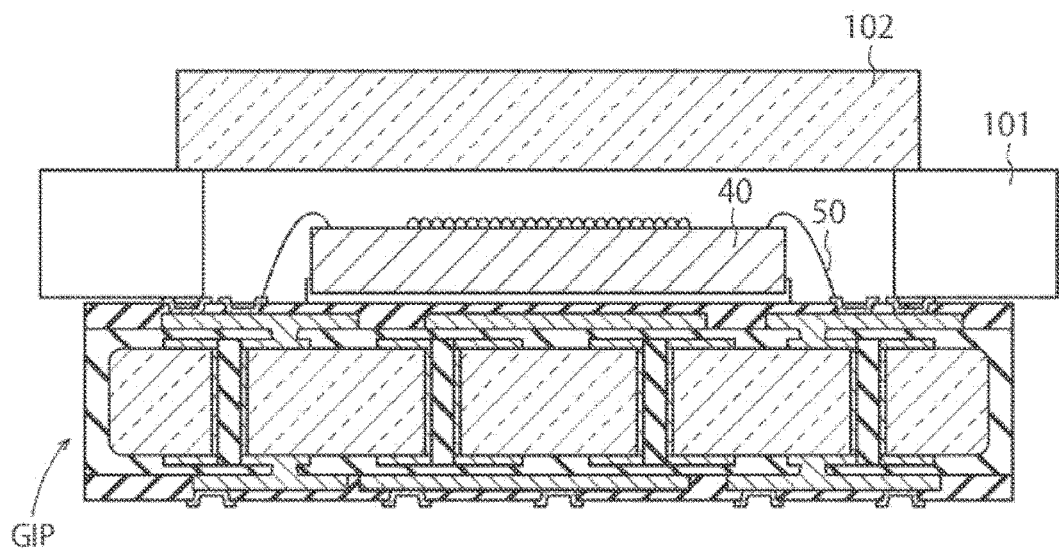
FIG. 20 is a cross-sectional view illustrating an application example of the GIP according to above-described embodiment.

FIG. 20 is a cross-sectional view illustrating an application example of the GIP according to above-described embodiment. The GIP may be one according to any of the first to fourth embodiments or modifications thereof.

The semiconductor chip 40 is a CMOS image sensor chip, and has a light receiving surface facing upward. The semiconductor chip 40 is bonded onto the GIP by an adhesive, and is electrically connected to a partial portion of the wiring of the GIP by the bonding wire 50.

A fixing frame 101 is disposed around the semiconductor chip 40. The fixing frame 101 is provided to fix a cover glass 102 at a predetermined position above the light receiving surface of the semiconductor chip 40.

The cover glass 102 protects the light receiving surface of the semiconductor chip 40 and transmits incident light to the light receiving surface. The cover glass 102 may be a condenser lens.

As described above, the GIP according to the present embodiment can be used as a substrate of a CMOS image sensor.

Second Application Example

Figure 21:
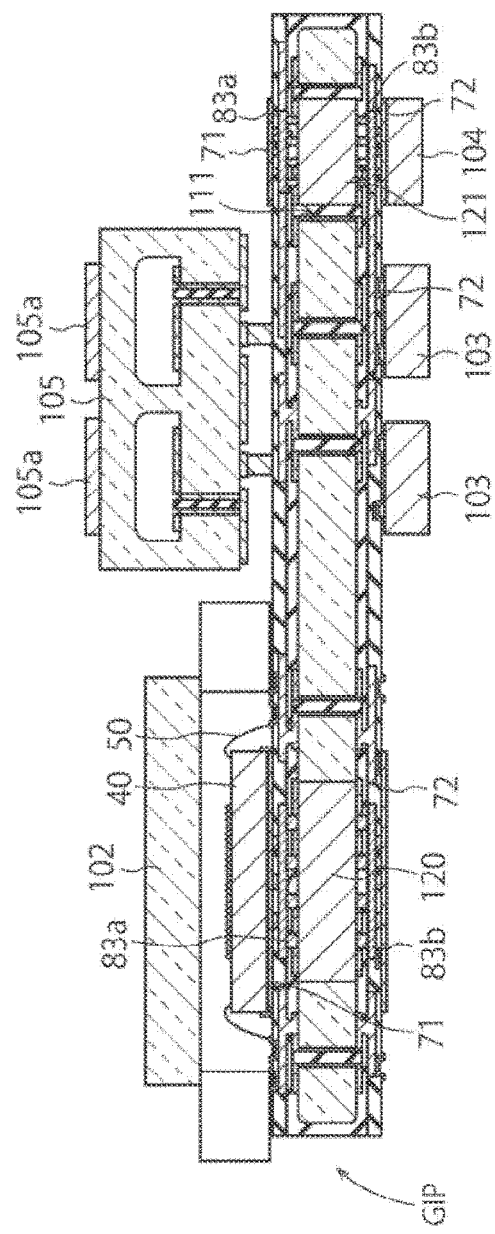
FIG. 21 is a cross-sectional view illustrating another application example of the GIP according to above-described embodiment.

FIG. 21 is a cross-sectional view illustrating another application example of the GIP according to above-described embodiment. The GIP may be basically one according to any of the first to fourth embodiments or modifications thereof. However, in the second application example, a CMOS image sensor chip 40, a signal processing chip 103, a power amplifier 104, and an antenna 105 are mounted on one GIP, and are configured as one module. Therefore, the GIP has a relatively large size. Furthermore, in this example, a metal plate 120 is embedded in the GIP below the CMOS image sensor chip 40. A metal plate 121 is embedded in the GIP below the power amplifier 104.

The arrangement relationship between the semiconductor chip 40, the fixing frame 101, and the cover glass 102 is the same as that in the first application example. The metal plate 120 is inserted into a lower portion of the opening 11. In this way, the metal plate 120 is provided in the opening 11, and the semiconductor chip 40 is provided above the metal plate 120. The metal plate 120 is in contact with a back surface of the semiconductor chip 40 via the wiring 83a and the metal pad 71 to absorb heat generated in the semiconductor chip 40 and release the heat from the second surface 10B of the glass substrate 10. Materials of the wiring 83a and the metal pad 71 are interposed between the metal plate 120 and the semiconductor chip 40. Also, materials of the wiring 83b and the metal pad 72 are provided on the second surface 10B side of the metal plate 120. The materials of the wirings 83a and 83b and the metal pads 71 and 72 are provided for forming a heat dissipation path.

The signal processing chip 103 is provided on the second surface 10B side, and is electrically connected to the electrode pad 72. The signal processing chip 103 performs arithmetic processing on a pixel signal photoelectrically converted and AD-converted by the semiconductor chip 40.

The GIP has an opening 111 in addition to the opening 11. The metal plate 121 is inserted into the opening 111. The power amplifier 104 is provided below the metal plate 121 in order to amplify a signal or the like received by the antenna 105. In this way, the metal plate 121 is provided in the opening 111. The metal plate 121 is in contact with a back surface of the power amplifier 104 via the wiring 83b and the metal pad 72 to absorb heat generated in the power amplifier 104 and release the heat from the first surface 10A of the glass substrate 10. Materials of the wiring 83b and the metal pad 72 are interposed between the metal plate 121 and the power amplifier 104. Also, materials of the wiring 83a and the metal pad 71 are provided on the first surface 10A side of the metal plate 121. The materials of the wirings 83a and 83b and the metal pads 71 and 72 are provided for forming a heat dissipation path.

The antenna 105 is provided on the first surface 10A side of the GIP. The antenna 105 is provided to receive an external signal and transmit an internal signal. The antenna 105 is configured by providing metal wiring 105a functioning as an antenna element on the glass substrate. The GIP has a feature in that a power loss of a high-frequency signal is low. Therefore, as in the second application example, for example, it is advantageous to mount a 5G antenna or the like.

As described above, the GIP according to the present embodiment can also be used as a substrate of a module of a CMOS image sensor. Therefore, the semiconductor device according to the present embodiment is advantageous in space saving and low power loss.

(First Modification)

Before the metal films 83a_1, 83b_1, and 61 are formed, insulating films may be formed on the first surface 10A and the second surface 10B and in the via V1 of the glass substrate 10. For these insulating films, for example, an insulating material such as an epoxy resin may be used.

In this case, next, the metal films 83a_1, 83b_1, and 61 are formed on surfaces of the insulating films on the first surface 10A and the second surface 10B and in the via V1 of the glass substrate 10. Next, the metal films 83a_1, 83b_1, and 61 are processed using a laser processing technique. The glass substrate 10 is divided into individual pieces by performing a dicing process.

Thereafter, as described with reference to FIGS. 12 to 16, the glass substrate 10 is disposed on the frame 20, and the wiring layers 81 and 82 are formed. According to the present modification, the metal films 83a_1, 83b_1, and 61 are formed on the insulating films, rather than directly contacting the glass substrate 10. However, the insulating films 90a and 90b can seamlessly and continuously cover the first surface 10A, the second surface 10B, and the side surface 10C of the glass substrate 10. Therefore, the first modification can obtain the same effect as the first embodiment.

(Second Modification)

Insulating films may be formed on the metal films 83a_1, 83b_1, and 61 before the dicing process.

For example, after the steps of FIGS. 8 to 10, insulating films are formed on the metal films 83a_1, 83b_1, and 61. An insulating film is also embedded in the via V1 to cover the metal film 61.

Next, the glass substrate 10 is divided into individual pieces by performing a dicing process.

Thereafter, as described with reference to FIGS. 12 to 16, the glass substrate 10 is disposed on the frame 20, and the wiring layers 81 and 82 are formed. According to the second modification, the insulating films 90a and 90b embedded between the frame 20 and the glass substrate 10 are different from and not continuous with the insulating films covering the metal films 83a_1, 83b_1, and 61. However, the insulating films 90a and 90b can seamlessly and continuously cover the first surface 10A, the second surface 10B, and the side surface 10C of the glass substrate 10. Therefore, the second modification can obtain the same effect as the first embodiment.

Fifth Embodiment

Figure 22:
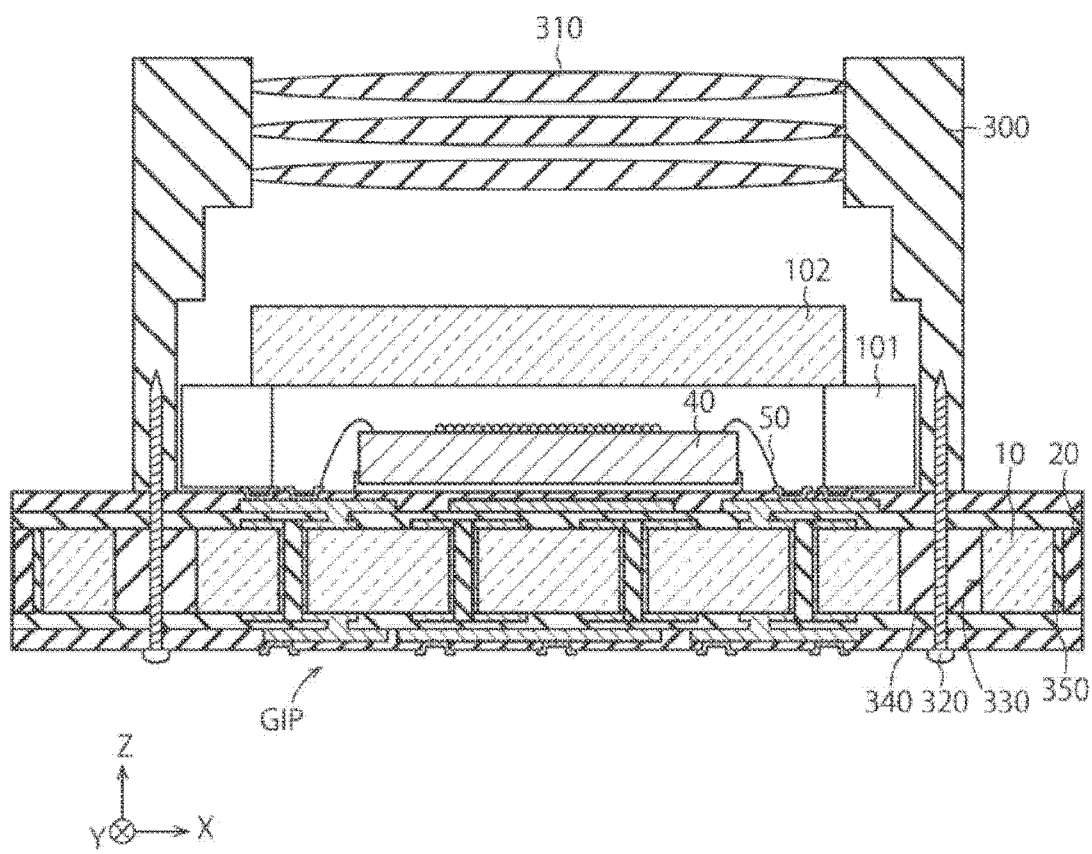
FIG. 22 is a cross-sectional view illustrating a configuration example of a semiconductor device according to a fifth embodiment.

FIG. 22 is a cross-sectional view illustrating a configuration example of a semiconductor device according to a fifth embodiment. In the fifth embodiment, the glass substrate 10 of the GIP is fastened to a housing 300, in which a lens group 310 is housed, by a screw 320 as a fastener. The glass substrate 10 has a fastening hole 330 allowing the screw 320 to pass therethrough. The fastening hole 330 is provided to penetrate through the glass substrate 10 between the first surface 10A and the second surface 20B.

A filler 340 is filled between the fastening hole 330 and the screw 320. The screw 320 is fastened to the housing 300 by penetrating through the filler 340 in the fastening hole 330, such that the glass substrate 10 is fixed to the housing 300. For example, an insulating material such as a resin is used for the filler 340. The frame 20 is bonded to the side surface of the glass substrate 10 by an adhesive 350.

The housing 300 has a substantially rectangular cylindrical shape to surround the periphery of the semiconductor chip 40. The lens group 310 is provided above the semiconductor chip 40 in the housing 300. The light having passed through the lens group 310 is incident on the semiconductor chip 40 serving as a CIS or the like.

The fastening hole 330 can be formed by irradiating the glass substrate 10 with laser light to change the quality of the glass substrate and etching the quality-changed portion using a hydrofluoric acid solution or the like. Alternatively, the fastening hole 330 may be formed by scraping the glass substrate 10 using laser ablation.

In the fifth embodiment, the GIP is directly fastened to the housing 300, and an end of the housing 300 is disposed on the GIP and is in contact with the GIP. As a result, the GIP can be fastened to the housing 300 without impairing the characteristics of the glass substrate 10 such as high flatness, little warpage, and little distortion. A contact surface B300 between the housing 300 and the GIP is an optical axis reference surface between an optical axis of the lens group 310 and an optical axis of the semiconductor chip 40. The optical axis reference surface is a contact surface having a large influence in order to make the optical axis of the lens group 310 and the optical axis of the semiconductor chip 40 substantially coincide with each other. Since the glass substrate 10 has excellent parallelism between a front surface and a back surface thereof, it is possible to make the optical axis of the lens group 310 and the optical axis of the semiconductor chip 40 substantially coincident with each other by processing the surfaces of the housing 300 and the GIP facing the contact surface B300 with high accuracy. Note that the configurations of the GIP, the fixing frame 101, the cover glass 102, and the semiconductor chip 40 may be the same as those in any of the above-described embodiments and the above-described modifications.

In this way, the GIP, the semiconductor chip 40, and the lens group 310 may be configured as an integrated module. As a result, this module can be incorporated into a product such as a camera in a state where the optical axes of the semiconductor chip 40 and the lens group 310 coincide with each other.

Figure 23:
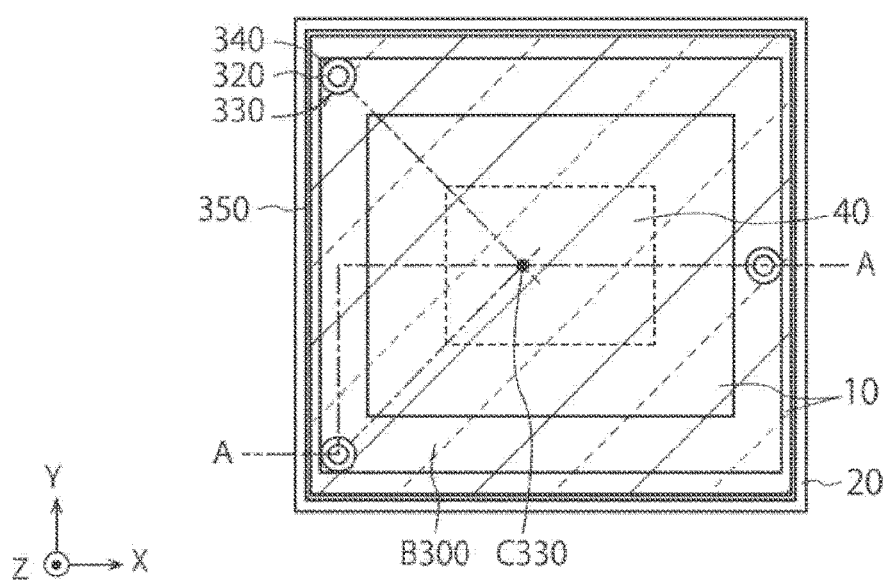
FIG. 23 is a schematic plan view illustrating a configuration example of the semiconductor device according to the fifth embodiment.

FIG. 23 is a schematic plan view illustrating a configuration example of the semiconductor device according to the fifth embodiment. A planar layout of the fastening hole 330 will be described with reference to FIG. 23. Note that FIG. 22 is a cross-sectional view taken along line A-A of FIG. 23.

In the present disclosure, three fastening holes 330 are provided in the glass substrate 10. The fastening holes 330 are provided within the contact surface B300 between the housing 300 and the GIP.

In a case where the fastening holes 330 are arranged to be biased to one side of the glass substrate 10, resonance or abnormal vibration may be induced when slight vibration propagates to the GIP. In this case, the vibration may also propagate to the semiconductor chip 40 and other components mounted on the GIP, and the semiconductor chip 40 and the other components may be damaged.

In order to suppress such damage, it is preferable that the plurality of fastening holes 330 is arranged so that the centers therebetween is disposed within the semiconductor chip 40 (disposed to overlap the semiconductor chip 40) in the planar layout viewed in a Z direction. In this way, by arranging the fastening holes 330 to be distributed in a substantially even manner, it is possible to suppress damage to the semiconductor chip 40 and other components mounted on the GIP.

Note that each of the number of screws 320 and the number of fastening holes 330 is not limited to three, and may be any number as long as it is two or more. However, as described above, it is preferable that the screws 320 and the fastening holes 330 are substantially evenly distributed within the contact surface B300.

Sixth Embodiment

Figure 24:
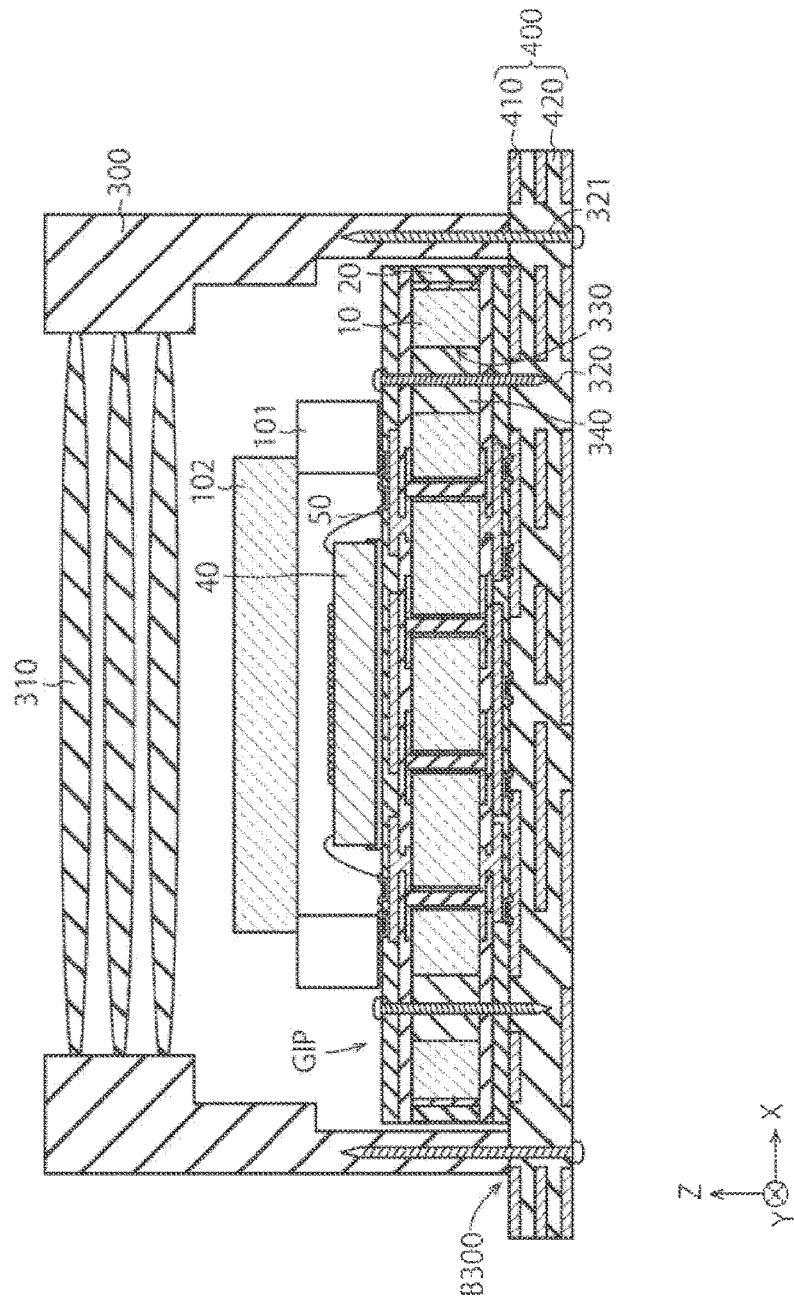
FIG. 24 is a cross-sectional view illustrating a configuration example of a semiconductor device according to a sixth embodiment.

FIG. 24 is a cross-sectional view illustrating a configuration example of a semiconductor device according to a sixth embodiment. In the sixth embodiment, the glass substrate 10 of the GIP is fastened to a mounting substrate 400 by a screw 320, and the mounting substrate 400 is fastened to the housing 300, in which the lens group 310 is housed, by a screw 321 as a fastener. That is, the GIP is fixed to the housing 300 via the mounting substrate 400.

The mounting substrate 400 is a wiring substrate in which a plurality of wiring layers 410 and a plurality of insulating layers 420 are stacked. For the wiring layers 410, for example, a metal material such as copper is used. For the insulating layers 420, for example, an insulating material such as a glass epoxy resin is used. In a region of the mounting substrate 400 contacting the housing 300, the wiring layers 410 are not provided, while the insulating layers 420 are provided. As a result, the screw 321 can penetrate through the mounting substrate 400 without contacting the wiring layers 410. The screw 321 is fastened to the housing 300 by penetrating through a region of the mounting substrate 400 only including the insulating layers 420.

Meanwhile, the configuration of the GIP may be the same as that in the fifth embodiment. However, the screw 320 is fastened to the mounting substrate 400 by penetrating through the fastening hole 330 in a −Z direction. In a region of the mounting substrate 400 corresponding to the fastening hole 330 as well, the wiring layers 410 are not provided, while the insulating layers 420 are provided. As a result, the screw 320 can be fastened to the mounting substrate 400 without contacting the wiring layers 410.

In the sixth embodiment, a contact surface B300 between the housing 300 and the mounting substrate 400 is an optical axis reference surface. In addition, since the glass substrate 10 has excellent parallelism between a front surface and a back surface thereof, parallelism between the semiconductor chip 40 mounted on the front surface of the GIP and the back surface of the GIP (that is, a front surface of the mounting substrate 400) is maintained. Therefore, by processing the surfaces of the housing 300 and the mounting substrate 400 facing the contact surface B300 with high accuracy, it is possible to make the optical axis of the lens group 310 and the optical axis of the semiconductor chip 40 substantially coincident with each other. Note that the configurations of the GIP, the fixing frame 101, the cover glass 102, and the semiconductor chip 40 may be the same as those in any of the above-described embodiments and the above-described modifications.

In this way, the GIP, the semiconductor chip 40, and the lens group 310 may be configured as an integrated module. As a result, this module can be incorporated into a product such as a camera in a state where the optical axes of the semiconductor chip 40 and the lens group 310 coincide with each other.

Figure 25:
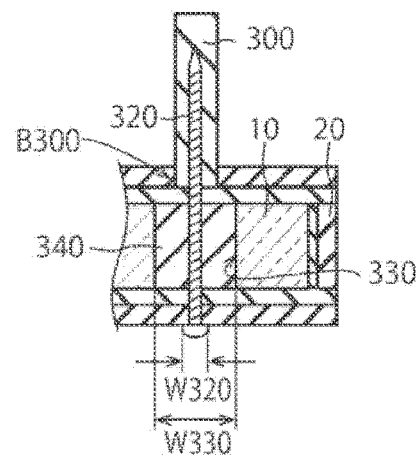
FIG. 25 is a cross-sectional view illustrating a fastened portion according to the fifth embodiment.

FIG. 25 is a cross-sectional view illustrating a fastened portion according to the fifth embodiment. The fastening hole 330 is provided within the contact surface B330 between the housing 300 and the GIP. Furthermore, a width W330 of the fastening hole 330 is preferably larger than a width W320 of a head of the screw 320. That is, as illustrated in FIGS. 23 and 25, the fastening hole 330 is formed to be larger than an outer diameter of the head of the screw 320 in plan view when it is viewed in the Z direction (a direction in which the screw 320 is fastened). In this way, the glass substrate 10 does not exist immediately under the head of the screw 320, and the head of the screw 320 presses the filler 340, rather than directly pressing the glass substrate 10, in a fastened state. As a result, it is possible to suppress a load when the screw 320 is fastened, which causes damage to the glass substrate 10. Note that the relationship between the fastening hole 330 and the screw 320 in the sixth embodiment is preferably the same as that in the fifth embodiment.

Seventh Embodiment

Figure 26:
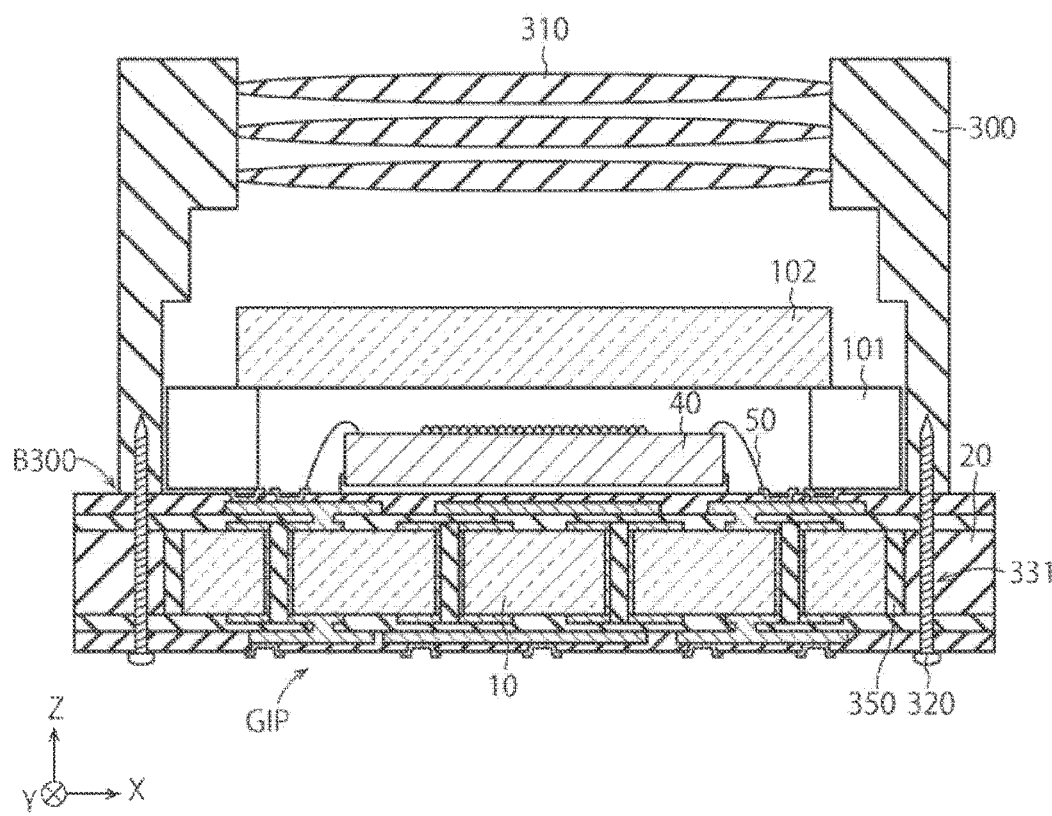
FIG. 26 is a cross-sectional view illustrating a configuration example of a semiconductor device according to a seventh embodiment.
Figure 27:
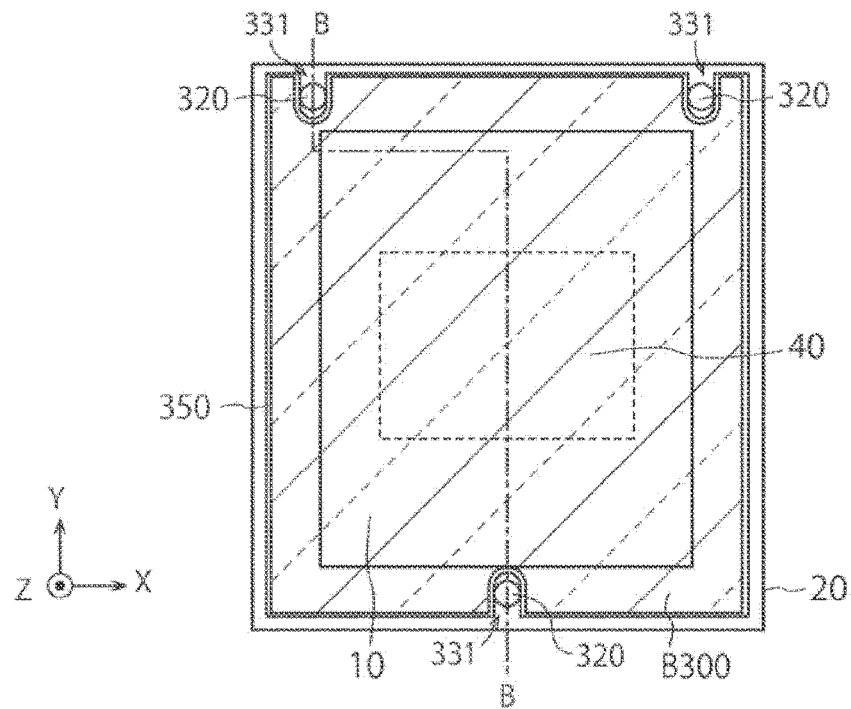
FIG. 27 is a schematic plan view illustrating a configuration example of the semiconductor device according to the seventh embodiment.

FIG. 26 is a cross-sectional view illustrating a configuration example of a semiconductor device according to a seventh embodiment. FIG. 27 is a schematic plan view illustrating a configuration example of the semiconductor device according to the seventh embodiment. FIG. 26 illustrates a cross section taken along line B-B of FIG. 27.

In the seventh embodiment, the fastening hole 330 is replaced with a fastening notch 331 connected to the outside on the side surface of the glass substrate 10. As illustrated in FIG. 27, the notch 331 is a portion recessed inward from the side surface of the glass substrate 10 within an X-Y plane. The frame 20 is provided inside the recessed portion of the notch 331. The frame 20 and the glass substrate 10 are bonded to each other by an adhesive 350. The screw 320 is fastened to the housing 300 by penetrating through the frame 20 in the notch 331. When a hole like the fastening hole 330 cannot be formed in the glass substrate 10, the notch 331 may be formed as described above. The notch 331 preferably has a smoothly continuous outer edge with no corner, in plan view when it is viewed in the Z direction, as illustrated in FIG. 27. As a result, the strength of the notch 331 can be maintained. The number of notches 331 is not limited to three, and may be any number as long as it is two or more. However, when the strength of the glass substrate 10 is taken into consideration, it is preferable to form notches 331 in a number as small as possible to reduce a contact portion between the glass substrate and the frame 20 as much as possible.

The other configurations in the seventh embodiment may be similar to the corresponding configurations in the fifth embodiment. Similarly to the fastening holes 330, the notches 331 are preferably distributed in a substantially even manner within the contact surface B300 between the GIP and the housing 300. Even though such notches 331 are adopted, the effect of the present disclosure is not lost. Note that the fastening holes 330 and the notches 331 may be mixed together.

(Modification)

Figure 28:
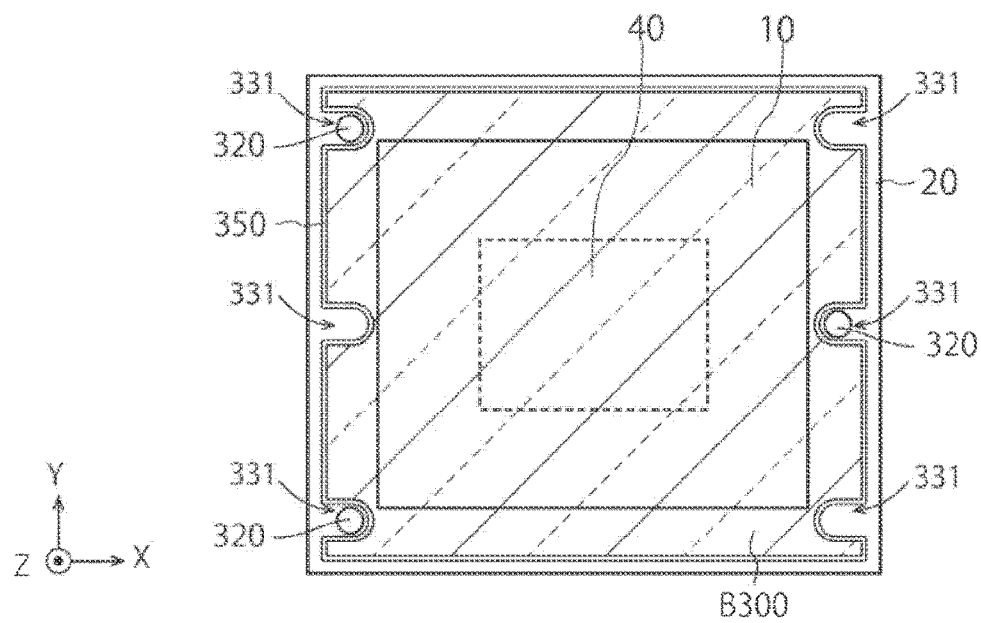
FIG. 28 is a cross-sectional view illustrating a configuration example of a semiconductor device according to a modification of the seventh embodiment.

FIG. 28 is a cross-sectional view illustrating a configuration example of a semiconductor device according to a modification of the seventh embodiment. In the present modification, six notches 331 are arranged to be line-symmetrical or point-symmetrical with respect to the center line or the center of the glass substrate 10. As a result, the notches 331 can be provided without impairing the characteristics of the glass substrate 10 such as flatness. In the modification, screws 320 are fastened to three notches 331 among the six notches 331. Note that, although it is preferable that all the notches 331 of the glass substrate 10 have the same size, the size may be changed if necessary in consideration of the overall balance.

The seventh embodiment and the present modification may be applied to the sixth embodiment.

Eighth Embodiment

Figure 29:
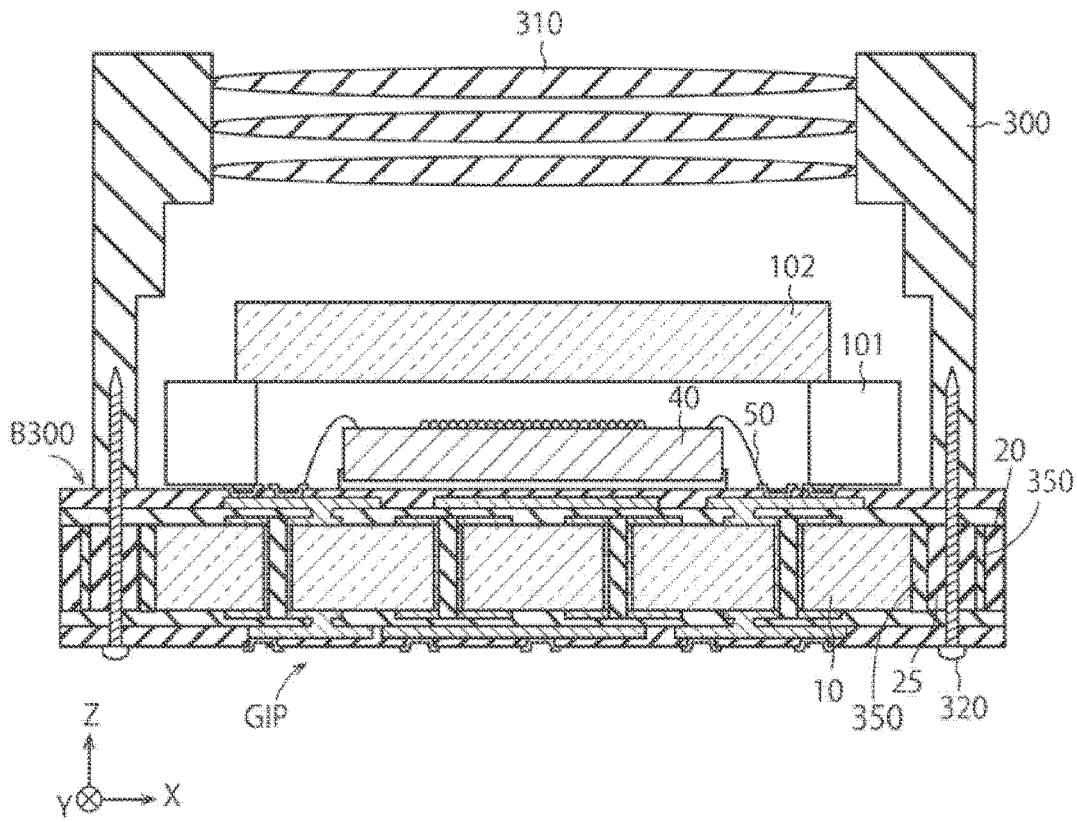
FIG. 29 is a cross-sectional view illustrating a configuration example of a semiconductor device according to an eighth embodiment.
Figure 30:
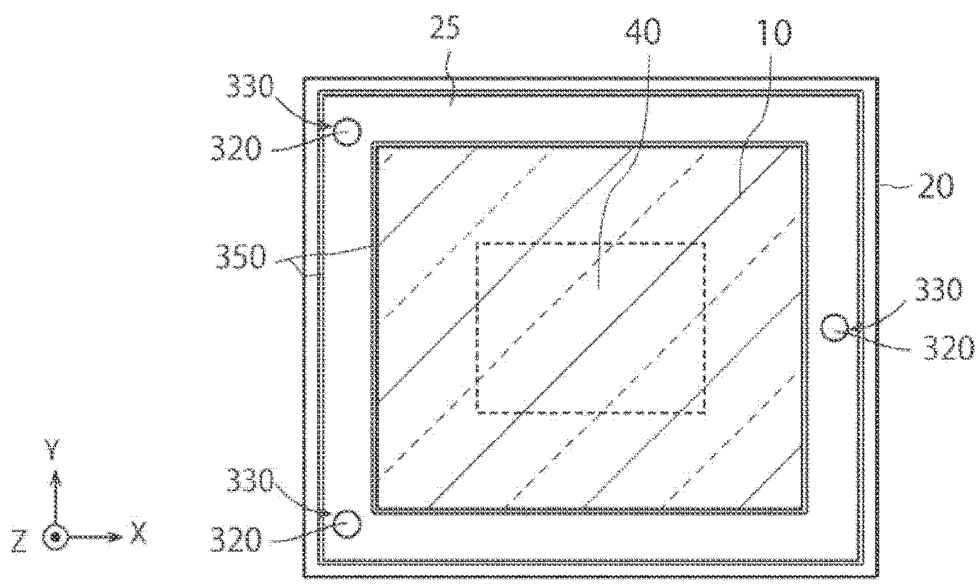
FIG. 30 is a plan view illustrating a configuration example of the semiconductor device according to the eighth embodiment.

FIG. 29 is a cross-sectional view illustrating a configuration example of a semiconductor device according to an eighth embodiment. FIG. 30 is a plan view illustrating a configuration example of the semiconductor device according to the eighth embodiment. In the eighth embodiment, a frame 25 is provided between the side surface of the glass substrate 10 and the frame 20. The frame 25 as a second frame is provided immediately below the housing 300 to fasten the GIP to the housing 300 using a screw 320. For the frame 25, a material other than glass is used. For example, for the frame 25, a metal material such as stainless steel is used in a case where high rigidity is required, an aluminum alloy, a titanium alloy, or the like is used in a case where weight reduction is required, and a copper alloy or the like is used in a case where high thermal conductivity is required.

As illustrated in FIG. 30, a fastening hole 330 is provided in the frame 25 to allow the screw 320 to penetrate therethrough. Although three fastening holes 330 are provided in the frame 25 in the present disclosure, the number of fastening holes 330 is not limited. Furthermore, the fastening holes 330 are preferably arranged in a substantially even manner in the frame 25.

The frame 25 is bonded to the side surface of the glass substrate 10 by an adhesive 350. Similarly, the frame 20 is bonded to an outer surface of the frame 25 by an adhesive 350.

Note that, since the frame 25 is configured as a part of the GIP, it is necessary to consider making a linear expansion coefficient and the like of the frame 25 closer to those of the glass substrate 10. For example, the relationship in linear expansion coefficient between the glass substrate 10, the frame 25, and the housing 300 is preferably glass substrate 10 frame 25 housing 300, or housing 300 frame 25 glass substrate 10. In this way, the thermal expansion coefficient gradually changes at the fastening portions from the glass substrate 10 to the housing 300, thereby reducing the overall stress of the module.

The other configurations in the eighth embodiment may be similar to the corresponding configurations in the fifth embodiment. The frame 25 may also function to protect the side surface of the glass substrate 10. In this case, the frame 20 may be omitted. Meanwhile, the package is divided into individual pieces through a dicing process of cutting the resin frame 20 in the manufacturing process. Therefore, when the frame 25 includes a metal material or the like that cannot be diced, it is preferable that the frame 20 is provided in addition to the frame 25.

(Modification)

Figure 31:
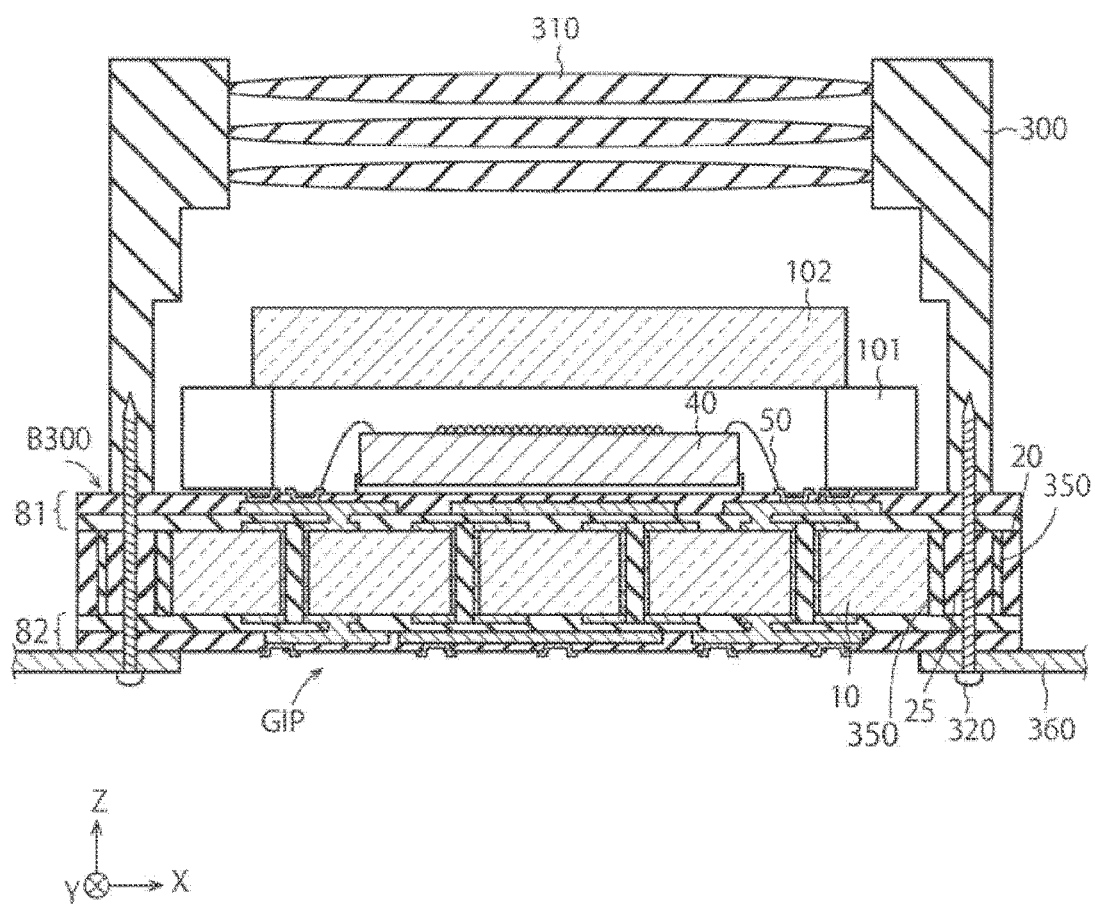
FIG. 31 is a cross-sectional view illustrating a configuration example of a semiconductor device according to a modification of the eighth embodiment.

FIG. 31 is a cross-sectional view illustrating a configuration example of a semiconductor device according to a modification of the eighth embodiment. In the present modification, a heat dissipation part 360 is fastened to and in contact with a bottom portion of the GIP by a screw 320. The heat dissipation part 360 is fastened to the second surface 10B side of the glass substrate 10 by the screw 320. The screw 320 not only fastens the GIP to the housing 300 but also fastens the heat dissipation part 360 to the GIP. For the heat dissipation part 360, for example, a material having high thermal conductivity such as copper or aluminum is used. As a result, heat in the housing 300 and the GIP can be exhausted from the heat dissipation part 360 via the screw 320 or the like. The heat in the GIP is transmitted to the heat dissipation part 360 via the laminated wiring parts 81 and 82, and can be efficiently discharged from the heat dissipation part 360.

Ninth Embodiment

Figure 32:
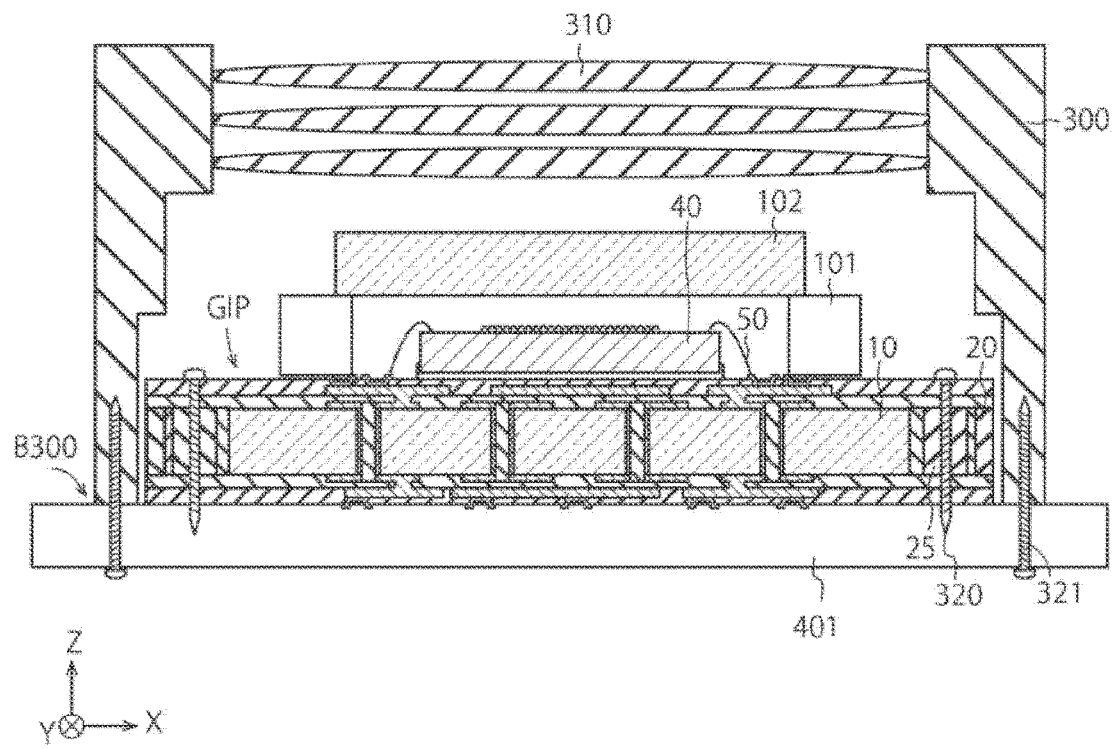
FIG. 32 is a cross-sectional view illustrating a configuration example of a semiconductor device according to a ninth embodiment.

FIG. 32 is a cross-sectional view illustrating a configuration example of a semiconductor device according to a ninth embodiment. In the ninth embodiment, the glass substrate 10 of the GIP is fastened to a substrate 401 by a screw 320, and the substrate 401 is fastened to the housing 300, in which the lens group 310 is housed, by a screw 321. That is, the GIP is fixed to the housing 300 via the substrate 401.

The substrate 401 is a plate-like substrate that is excellent in heat dissipation, flatness, parallelism, and rigidity. For the substrate 401, for example, copper, aluminum, tungsten, molybdenum, niobium, titanium, an alloy containing any of these metals, or an alloy such as stainless steel, duralumin, invar, kovar, or brass is used. In this way, the glass substrate 10 is fastened to the substrate 401 through the frame 25 by the screw 320, and is in close contact with the substrate 401. Moreover, the substrate 401 is fastened to the housing 300 via the screw 321, and is in close contact with the housing 300, thereby making it possible to further enhance rigidity and heat dissipation. The screw 321 penetrates through the substrate 401 and is fastened to the housing 300.

Meanwhile, the configuration of the GIP may be the same as that in the eighth embodiment. However, the screw 320 is fastened to the substrate 401 by penetrating through the frame 25 in the −Z direction. The substrate 401 and the GIP may be fixed to each other via an adhesive having high thermal conductivity or the like.

Tenth Embodiment

Figure 33:
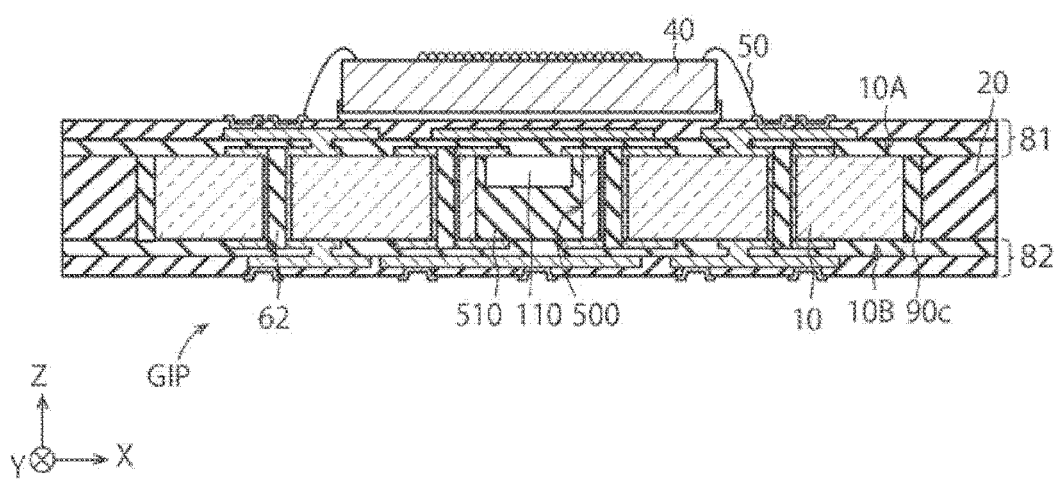
FIG. 33 is a cross-sectional view illustrating a configuration example of a semiconductor device according to a tenth embodiment.
Figure 34:
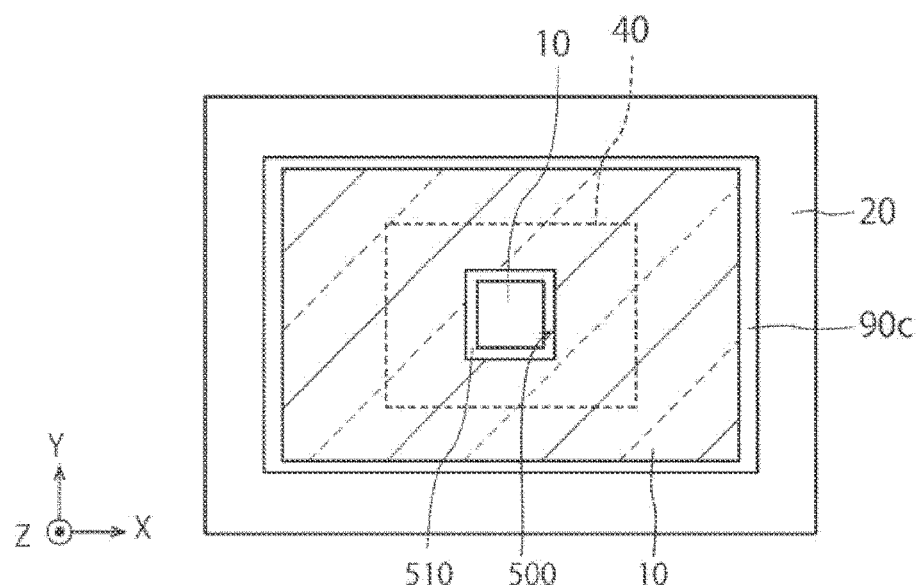
FIG. 34 is a schematic plan view illustrating a configuration example of the semiconductor device according to the tenth embodiment.

FIG. 33 is a cross-sectional view illustrating a configuration example of a semiconductor device according to a tenth embodiment. FIG. 34 is a schematic plan view illustrating a configuration example of the semiconductor device according to the tenth embodiment. In the tenth embodiment, an electronic component 110 is built in the glass substrate 10 of the GIP. A through hole (cavity) 500 is provided in the glass substrate 10 immediately below the semiconductor chip 40, and the electronic component 110 is disposed in the through hole 500. The through hole 500 is provided in the central portion of the glass substrate 10 to penetrate through the glass substrate 10 between the first surface 10A and the second surface 20B. As illustrated in FIG. 34, the through hole 500 is formed to have a size capable of accommodating the electronic component 110. An insulating film 510 is filled in a space of the through hole 500 in which the electronic component 110 is not placed. The insulating film 510 may include the same material as the insulating films 62 and 90c, and may be embedded in the space of the through hole 500 in the same process as the insulating films 62 and 90c.

The through hole 500 can be formed by irradiating the glass substrate 10 with laser light to change the quality of the glass substrate and etching the quality-changed portion using a hydrofluoric acid solution or the like. Alternatively, the through hole 500 may be formed by scraping the glass substrate 10 using laser ablation.

As illustrated in FIG. 33, an upper surface of the electronic component 110 is aligned with the first surface 10A of the glass substrate 10. In addition, the electronic component 110 is connected to any of the wirings of the laminated wiring part 81 on the first surface 10A side of the glass substrate 10. As a result, electric power can be supplied from the outside to the electronic component 110 via the wiring of the laminated wiring part 81, and a control signal can be given to the electronic component 110, or data can be output from the electronic component 110. The other configurations of the GIP in the tenth embodiment may be similar to the corresponding configurations in any of the above-described embodiments and the above-described modifications. Note that, in the tenth embodiment, it does not matter whether the frame 20 is present or absent.

The electronic component 110 may be, for example, either an active component or a passive component. As an active component, the electronic component 110 may be, for example, a digital signal processor (DSP), a dynamic random access memory (DRAM), a static RAM (SRAM), a magnetoresistive RAM (MRAM), a field-programmable gate array (FPGA), a gyro sensor, an acceleration sensor, an inertial measurement chip (inertial measurement unit (IMU)), or the like. As a passive component, the electronic component 110 may be, for example, a chip capacitor, a chip inductor, a thin film capacitor, or the like.

According to the tenth embodiment, since the electronic component 110 is disposed in the through hole 500 immediately below the semiconductor chip 40, a wiring distance between the electronic component 110 and the semiconductor chip 40 is short. This makes it possible to speed up the overall operation of the package and reduce noise. For example, when the semiconductor chip 40 or the electronic component 110 includes a capacitor, the noise of the capacitor is reduced. When the semiconductor chip 40 or the electronic component 110 includes a CPU, the CPU operates at a high speed. When the semiconductor chip 40 or the electronic component 110 includes an IMU, the detection accuracy of the IMU is improved.

In addition, since the electronic component 110 is disposed in the glass substrate 10, the size of the package is reduced.

When a silicon material is used for the electronic component 110, a difference in selective expansion coefficient between the electronic component 110 and the glass substrate 10 is reduced. Therefore, stress on the GIP is reduced, and reliability is improved.

Since the electronic component 110 is built in the glass substrate 10, a degree of freedom increases when a heat dissipation plate or the like is installed on the GIP.

A method for manufacturing the module according to the tenth embodiment is as follows. The steps illustrated in FIGS. 8 to 12 are performed. At this time, the glass substrate 10 and the frame 20 are mounted on a support substrate (support tape) 502. A through hole 500 is formed in the central portion of the glass substrate 10.

Figure 35:
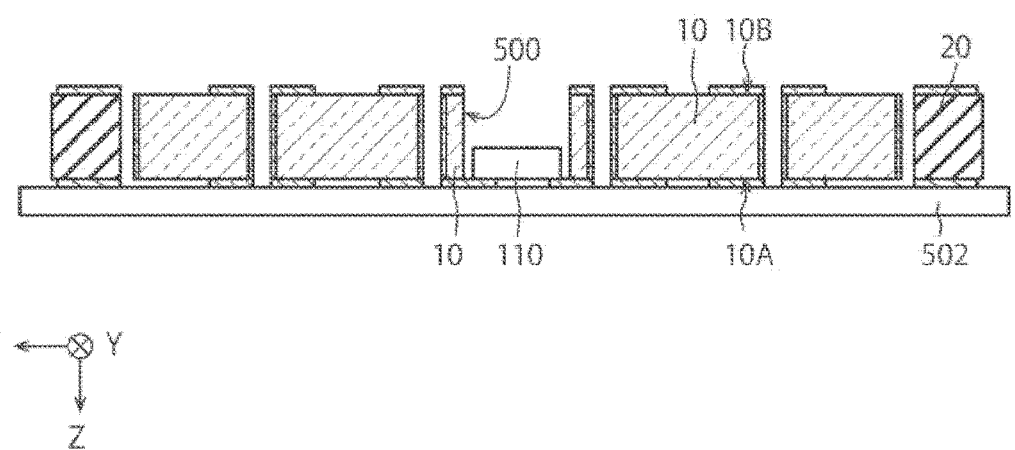
FIG. 35 is a cross-sectional view illustrating a method for manufacturing the semiconductor device according to the tenth embodiment.

Next, as illustrated in FIG. 35, the electronic component 110 is mounted on the support substrate (support tape) 502 in the through hole 500. Note that FIG. 35 is a cross-sectional view illustrating a method of manufacturing the semiconductor device according to the tenth embodiment. In the process of manufacturing the semiconductor device, as illustrated in FIG. 35, the first surface 10A of the glass substrate 10 is disposed to face the support substrate 502. Therefore, at this stage, a surface of the electronic component 110 is substantially flush with the first surface 10A of the glass substrate 10. The resin material described with reference to FIG. 13 is embedded inside the through hole 500 and inside the via V1 and the like simultaneously. That is, the insulating film 510 is formed simultaneously with the insulating films 62 and 90c. The electronic component 110 is resin-sealed by the insulating film 510 in a state where its surface remains aligned with the first surface 10A of the glass substrate 10. As a result, the laminated wiring part 81 formed thereafter can easily connect a terminal of the electronic component 110 and a wiring on the first surface 10A of the glass substrate 10.

Thereafter, the module according to the tenth embodiment is completed through the steps described with reference to FIG. 13 to 15 or 16.

(Modification)

Figure 36:
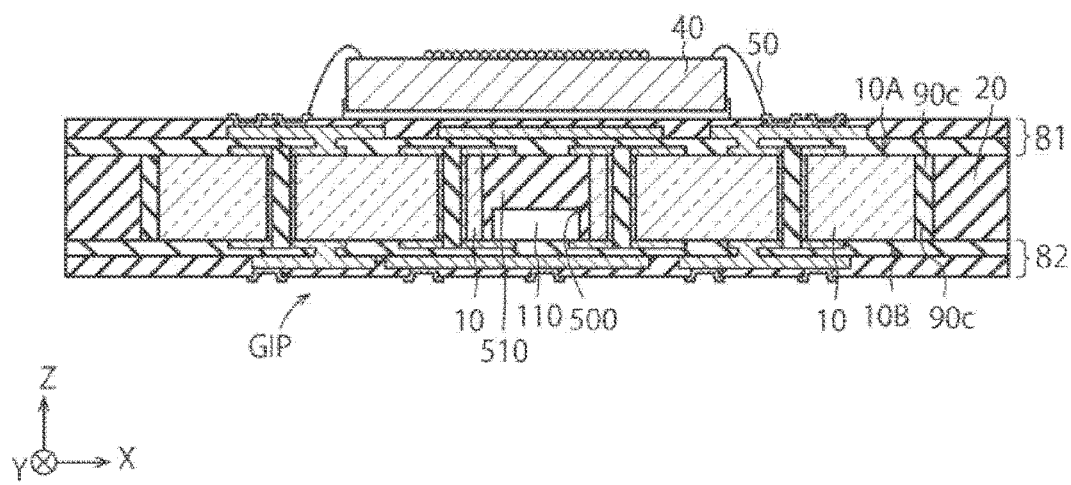
FIG. 36 is a cross-sectional view illustrating a configuration example of a semiconductor device according to a modification of the tenth embodiment.

FIG. 36 is a cross-sectional view illustrating a configuration example of a semiconductor device according to a modification of the tenth embodiment. In the present modification, one surface of the electronic component 110 is aligned with the second surface 10B of the glass substrate 10. In addition, the electronic component 110 is connected to any of the wirings of the laminated wiring part 82 on the second surface 10B side of the glass substrate 10. The other configurations in the present modification may be similar to the corresponding configurations in the tenth embodiment. Therefore, the present modification can obtain the same effects as the tenth embodiment.

In the present modification, the glass substrate 10 illustrated in FIG. 35 may be turned upside down, such that the second surface 10B faces the support substrate 502. In this way, the bottom surface of the electronic component 110 is substantially flush with the second surface 10B of the glass substrate 10. As a result, the laminated wiring part 82 formed thereafter can easily connect a terminal of the electronic component 110 and a wiring on the second surface 10B of the glass substrate 10.

Eleventh Embodiment

Figure 37:
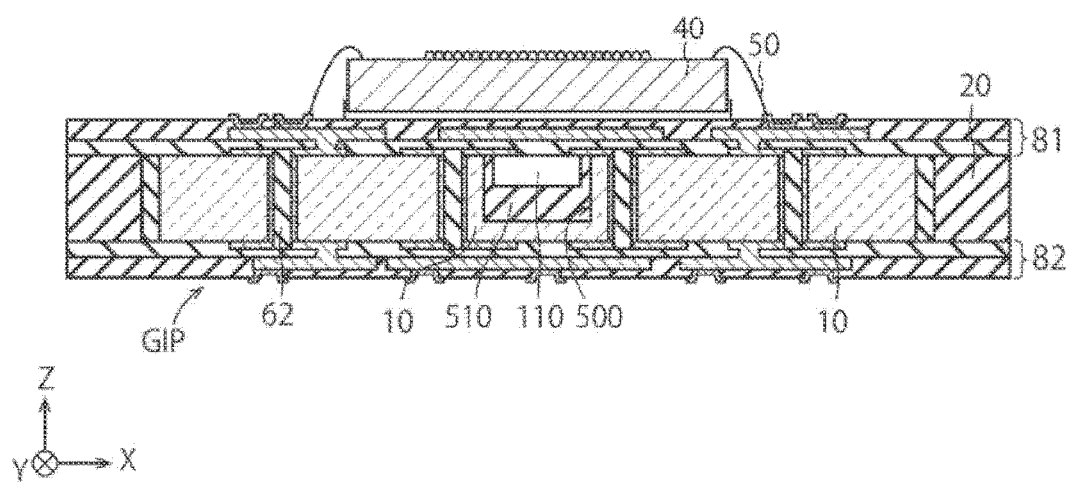
FIG. 37 is a cross-sectional view illustrating a configuration example of a semiconductor device according to an eleventh embodiment.

FIG. 37 is a cross-sectional view illustrating a configuration example of a semiconductor device according to an eleventh embodiment. A plan view of the semiconductor device according to the eleventh embodiment may be the same as that of FIG. 34. In the eleventh embodiment, a counterbore (recess) 501 is provided in the glass substrate 10 immediately below the semiconductor chip 40, and the electronic component 110 is disposed in the counterbore 501. The counterbore 501 is provided in the first surface 10A of the glass substrate 10, but does not penetrate through the glass substrate 10 so as to have a bottom. The counterbore 501 is formed to have a size capable of accommodating the electronic component 110. An insulating film 510 is filled in a space of the counterbore 501 in which the electronic component 110 is not placed.

The counterbore 501 can be formed by irradiating the glass substrate 10 with laser light to change the quality of the glass substrate and etching the quality-changed portion using a hydrofluoric acid solution or the like. Alternatively, the counterbore 501 may be formed by scraping the glass substrate 10 using laser ablation.

An upper surface of the electronic component 110 is aligned with the first surface 10A of the glass substrate 10. In addition, the electronic component 110 is connected to any of the wirings of the laminated wiring part 81 on the first surface 10A side of the glass substrate 10. The other configurations of the GIP in the eleventh embodiment may be similar to the corresponding configurations in the tenth embodiment. Therefore, the eleventh embodiment can obtain the same effects as the tenth embodiment.

Figure 38:
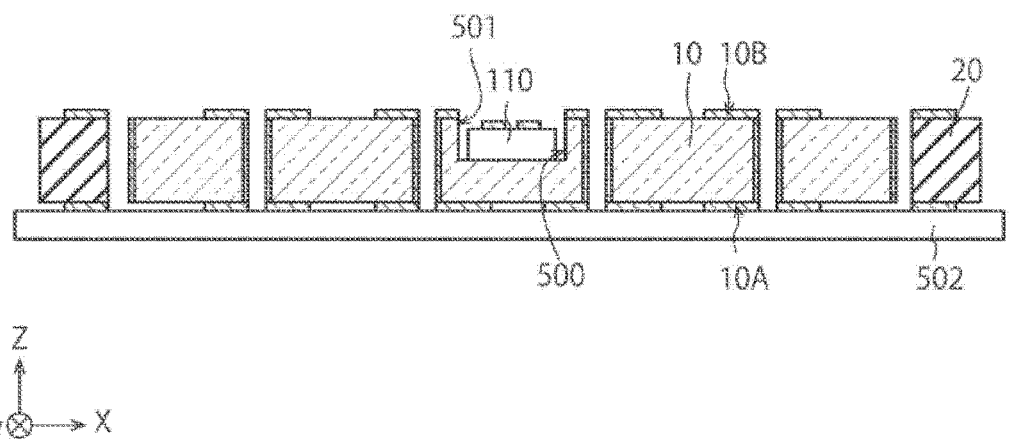
FIG. 38 is a cross-sectional view illustrating a method for manufacturing the semiconductor device according to the eleventh embodiment.

A method for manufacturing the module according to the eleventh embodiment is as follows. The steps illustrated in FIGS. 8 to 12 are performed. At this time, the glass substrate 10 and the frame 20 are mounted on a support substrate (support tape) 502. A counterbore 501 is formed in the central portion of the glass substrate 10. As illustrated in FIG. 38, the glass substrate 10 is disposed on the support substrate 502 with the counterbore 501 facing upward. Note that FIG. 38 is a cross-sectional view illustrating a method of manufacturing the semiconductor device according to the eleventh embodiment.

Next, the electronic component 110 is bonded after being mounted in the counterbore 501. The counterbore 501 is formed to have a depth so that a surface of the electronic component 110 is substantially flush with the first surface 10A of the glass substrate 10. Next, the resin material described with reference to FIG. 13 is embedded inside the counterbore 501 and inside the via V1 and the like simultaneously. The electronic component 110 is resin-sealed in a state where its surface remains aligned with the first surface 10A of the glass substrate 10. As a result, the laminated wiring part 81 formed thereafter can easily connect a terminal of the electronic component 110 and a wiring on the first surface 10A of the glass substrate 10.

Thereafter, the module according to the eleventh embodiment is completed through the steps described with reference to FIG. 13 to 15 or 16.

Twelfth Embodiment

Figure 39:
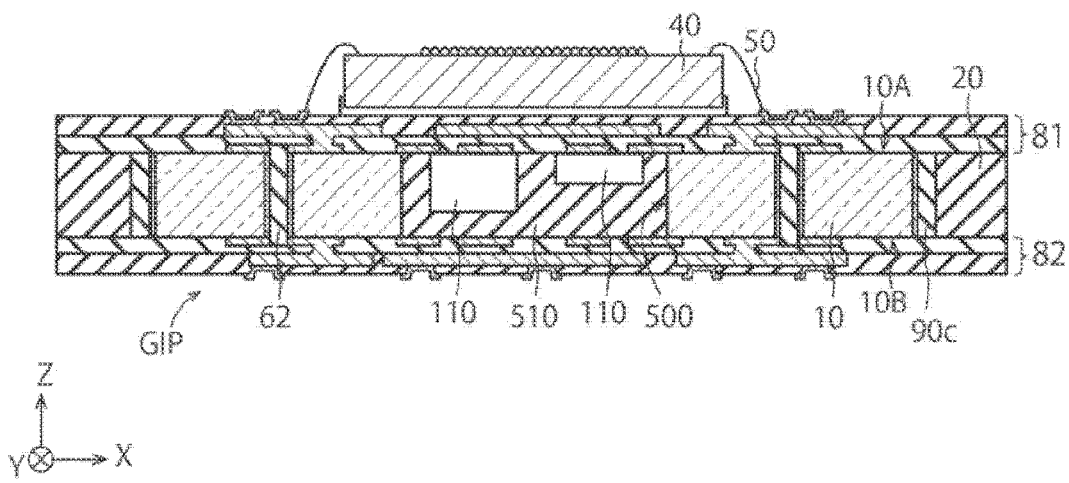
FIG. 39 is a cross-sectional view illustrating a configuration example of a semiconductor device according to a twelfth embodiment.
Figure 40:
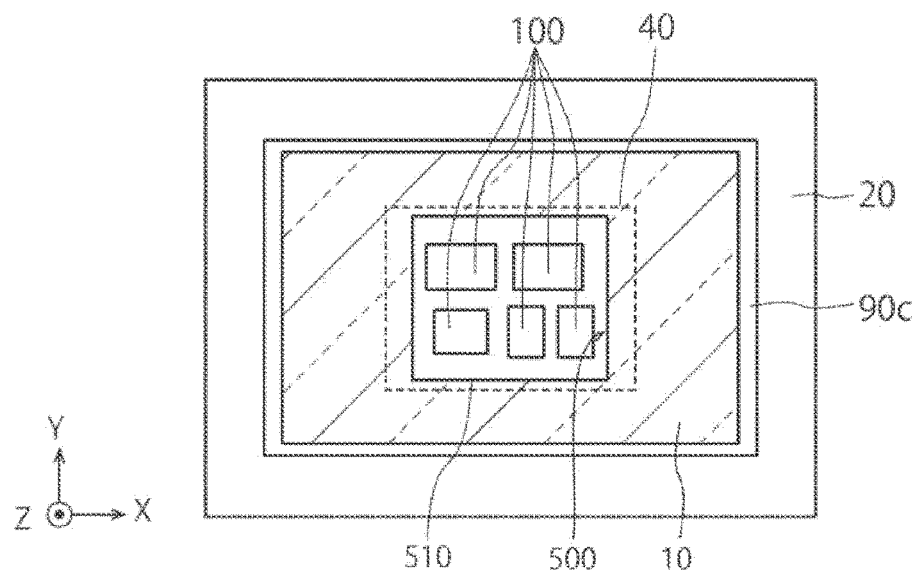
FIG. 40 is a plan view illustrating a configuration example of the semiconductor device according to the twelfth embodiment.

FIG. 39 is a cross-sectional view illustrating a configuration example of a semiconductor device according to a twelfth embodiment. FIG. 40 is a plan view illustrating a configuration example of the semiconductor device according to the twelfth embodiment. In the twelfth embodiment, a plurality of electronic components 110 is built in the through hole 500 of the glass substrate 10. In this way, the plurality of electronic components 110 may be built in through hole 500 by changing the size of through hole 500.

In addition, as illustrated in FIG. 39, even though the plurality of electronic components 110 has different thicknesses (heights) from each other, upper surfaces of the plurality of components 110 can be aligned to be substantially flush with the first surface 10A (or the second surface 10B) of the glass substrate 10 by manufacturing the semiconductor device in the same manner as in the tenth embodiment. As a result, the plurality of electronic components 110 having different areas and different heights (thicknesses) can be arranged in the through hole 500 and connected to the laminated wiring part 81 (or 82).

The other configurations in the twelfth embodiment may be similar to the corresponding configurations in the tenth embodiment. As a result, the twelfth embodiment can obtain the same effects as the tenth embodiment.

Thirteenth Embodiment

Figure 41:
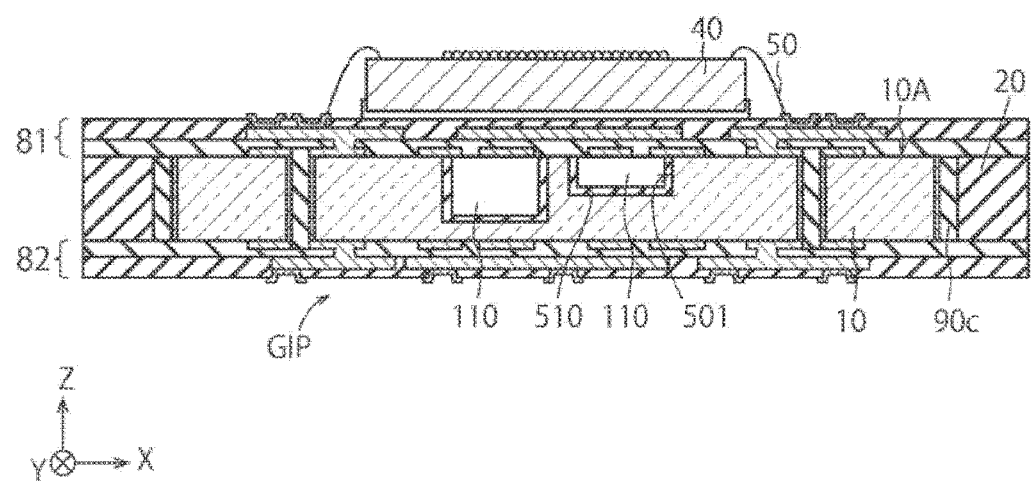
FIG. 41 is a cross-sectional view illustrating a configuration example of a semiconductor device according to a thirteenth embodiment.

FIG. 41 is a cross-sectional view illustrating a configuration example of a semiconductor device according to a thirteenth embodiment. A plan view of the semiconductor device according to the thirteenth embodiment may be the same as that of FIG. 40. In the thirteenth embodiment, a plurality of counterbores 501 is provided in the glass substrate 10 immediately below the semiconductor chip 40, and a plurality of electronic components 110 is arranged in the respective counterbores 501. In this way, the plurality of electronic components 110 may be built in the glass substrate 10 by providing the plurality of counterbores 501.

Furthermore, as illustrated in FIG. 41, when the plurality of electronic components 110 has different thicknesses (heights) from each other, it is preferable to set the depths of the plurality of counterbores 501 in accordance with the respective thicknesses of the electronic components 110. As a result, the upper surfaces of the plurality of components 110 can be aligned to be substantially flush with the first surface 10A of the glass substrate 10.

The other configurations in the thirteenth embodiment may be similar to the corresponding configurations in the eleventh embodiment. As a result, the thirteenth embodiment can obtain the same effects as the eleventh embodiment.

In the tenth to thirteenth embodiments, in a case where the electronic component 110 is a gyro sensor, the electronic component 110 is preferably disposed immediately below the semiconductor chip 40 to be aligned with the central axis of the semiconductor chip 40. This makes it possible to improve the accuracy of the gyro sensor in detecting an angular velocity. For example, a moving body such as a drone or a vehicle may vibrate at several hundred Hz. In a case where the device according to the present disclosure is installed on such a moving body, an output signal (particularly, an angular velocity) from the gyro sensor as the electronic component 110 needs to be corrected at several hundred Hz, and highly accurate correction processing is required. By disposing the electronic component 110 immediately below the semiconductor chip 40 to be aligned with the central axis thereof according to the present disclosure, angular velocity correction processing or the like is relatively easy.

In a case where the gyro sensor is disposed at a position deviated from the central axis of the semiconductor chip 40, it is necessary to arrange a plurality of gyro sensors around the semiconductor chip 40. However, by disposing the electronic component 110 immediately below the semiconductor chip 40 to be aligned with the central axis thereof according to the present disclosure, it is possible to reduce the number of gyro sensors.

Fourteenth Embodiment

Figure 42:
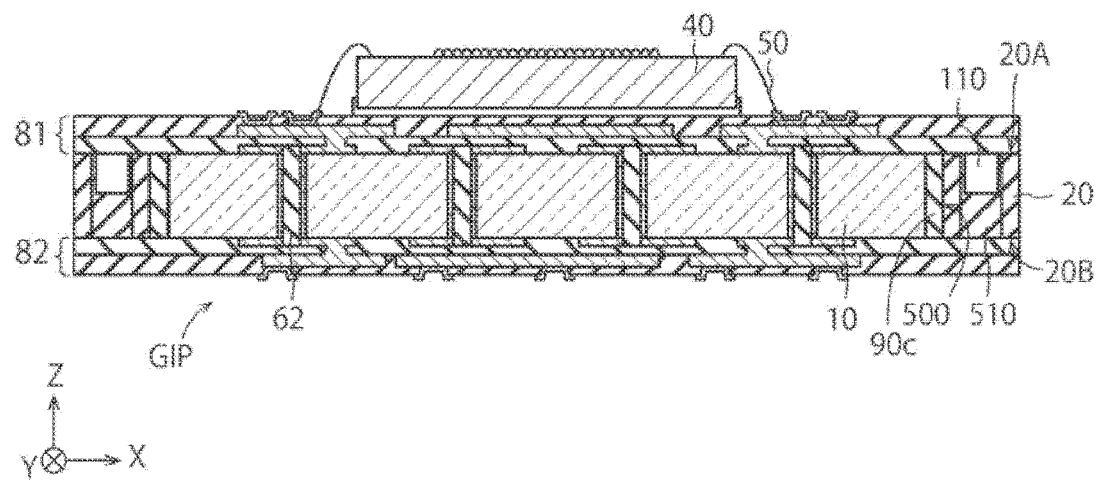
FIG. 42 is a cross-sectional view illustrating a configuration example of a semiconductor device according to a fourteenth embodiment.
Figure 43:
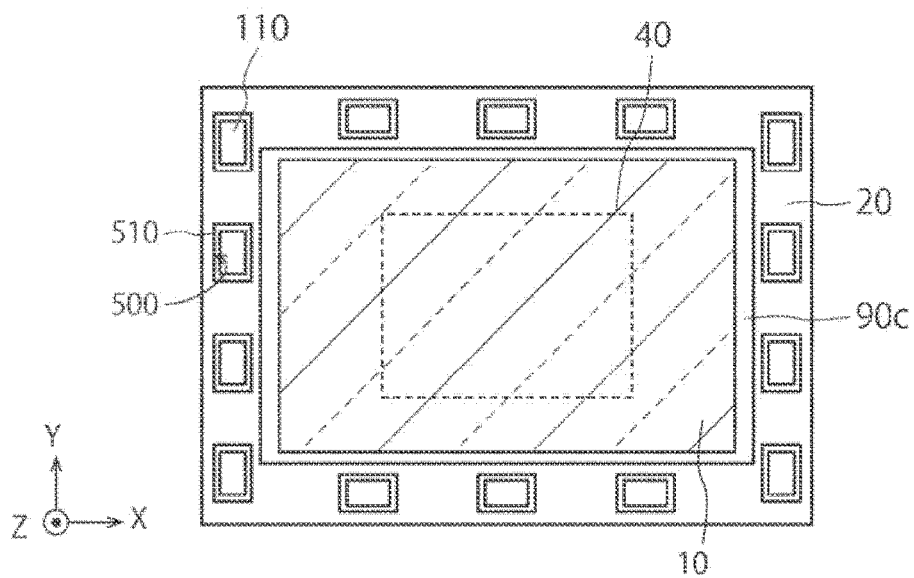
FIG. 43 is a schematic plan view illustrating a configuration example of the semiconductor device according to the fourteenth embodiment.

FIG. 42 is a cross-sectional view illustrating a configuration example of a semiconductor device according to a fourteenth embodiment. FIG. 43 is a schematic plan view illustrating a configuration example of the semiconductor device according to the fourteenth embodiment. In the fourteenth embodiment, an electronic component 110 is built in the frame 20 of the GIP. A through hole (cavity) 500 is provided in the frame 20, and the electronic component 110 is disposed in the through hole 500. The through hole 500 is provided to penetrate through the frame 20 between the third surface 20A and the fourth surface 20B. The through hole 500 is formed to have a size capable of accommodating the electronic component 110. An insulating film 510 is filled in a space of the through hole 500 in which the electronic component 110 is not placed. The insulating film 510 may include the same material as the insulating films 62 and 90c, and may be embedded in the space of the through hole 500 in the same process as the insulating films 62 and 90c. The through hole 500 may be formed by scraping the frame 20 using laser ablation.

As illustrated in FIG. 42, an upper surface of the electronic component 110 is aligned with the third surface 20A of the frame 20. In addition, the electronic component 110 is connected to any of the wirings of the laminated wiring part 81 on the third surface 20A side of the frame 20. As a result, electric power can be supplied from the outside to the electronic component 110 via the wiring of the laminated wiring part 81, and a control signal can be given to the electronic component 110, or data can be output from the electronic component 110. The other configurations in the fourteenth embodiment may be similar to the corresponding configurations in the tenth embodiment.

According to the fourteenth embodiment, although the electronic component 110 is not provided immediately below the semiconductor chip 40, the size of the package can be reduced. Furthermore, a degree of freedom is high in installing a heat dissipation plate and the like.

In a method for manufacturing the module according to the fourteenth embodiment, the frame 20 with the through hole 500 formed therein is mounted on the support substrate 502, and the electronic component 110 is mounted on the support substrate 502 in the through hole 500. The subsequent steps may be the same as those in the manufacturing method in the tenth embodiment.

(Modification)

Figure 44:
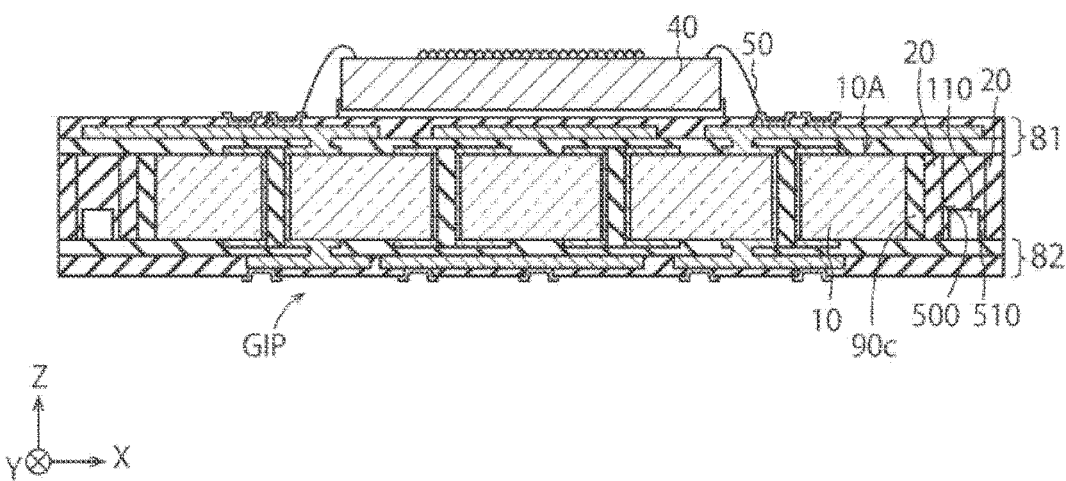
FIG. 44 is a cross-sectional view illustrating a configuration example of a semiconductor device according to a modification of the fourteenth embodiment.

FIG. 44 is a cross-sectional view illustrating a configuration example of a semiconductor device according to a modification of the fourteenth embodiment. In the present modification, one surface of the electronic component 110 is aligned with the fourth surface 20B of the frame 20. In addition, the electronic component 110 is connected to any of the wirings of the laminated wiring part 82 on the fourth surface 20B side of the frame 20. The other configurations in the present modification may be similar to the corresponding configurations in fourteenth embodiment. Therefore, the present modification can obtain the same effects as the fourteenth embodiment.

Fifteenth Embodiment

Figure 45:
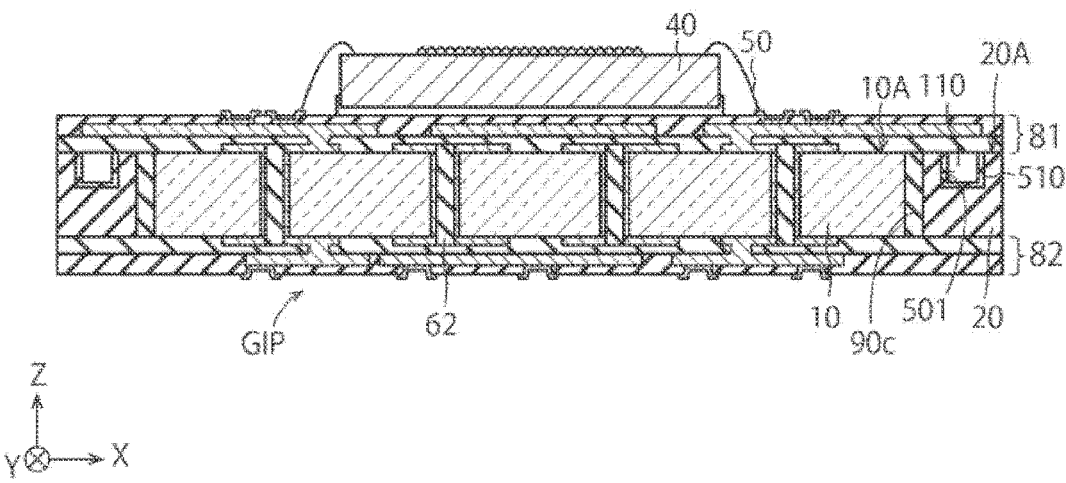
FIG. 45 is a cross-sectional view illustrating a configuration example of a semiconductor device according to a fifteenth embodiment.

FIG. 45 is a cross-sectional view illustrating a configuration example of a semiconductor device according to a fifteenth embodiment. A plan view of the semiconductor device according to the fifteenth embodiment may be the same as that of FIG. 43. In the fifteenth embodiment, a counterbore (recess) 501 is provided in the frame 20, and the electronic component 110 is disposed in the counterbore 501. The counterbore 501 is provided in the third surface 20A of the frame 20, but does not penetrate through the frame 20 so as to have a bottom. The counterbore 501 is formed to have a size capable of accommodating the electronic component 110. An insulating film 510 is filled in a space of the counterbore 501 in which the electronic component 110 is not placed. The counterbore 501 may be formed by scraping the frame 20 using laser ablation.

An upper surface of the electronic component 110 is aligned with the third surface 20A of the frame 20. In addition, the electronic component 110 is connected to any of the wirings of the laminated wiring part 81 on the third surface 20A side of the frame 20. The other configurations of the GIP in the fifteenth embodiment may be similar to the corresponding configurations in the fourteenth embodiment. Therefore, the fifteenth embodiment can obtain the same effects as the fourteenth embodiment.

In a method for manufacturing the module according to the fifteenth embodiment, the frame 20 with the counterbore 501 formed therein is mounted on the support substrate 502, and the electronic component 110 is mounted in the counterbore 501. The other steps may be the same as those in the manufacturing method in the fourteenth embodiment.

Sixteenth Embodiment

Figure 46:
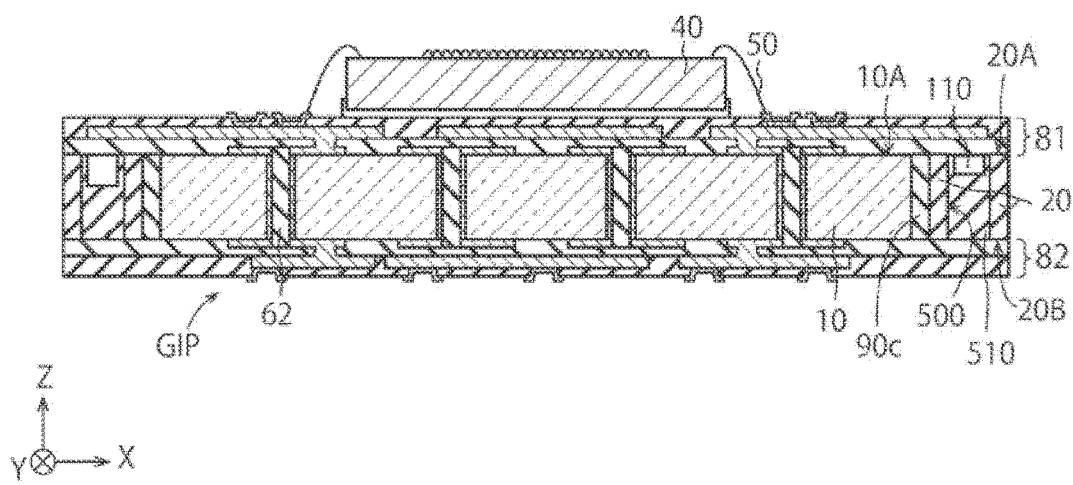
FIG. 46 is a cross-sectional view illustrating a configuration example of a semiconductor device according to a sixteenth embodiment.
Figure 47:
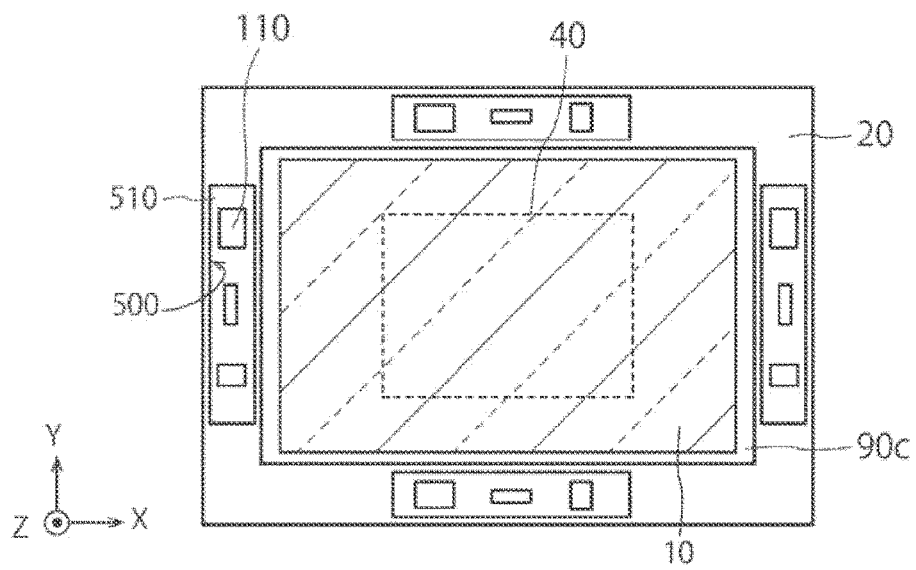
FIG. 47 is a plan view illustrating a configuration example of the semiconductor device according to the sixteenth embodiment.

FIG. 46 is a cross-sectional view illustrating a configuration example of a semiconductor device according to a sixteenth embodiment. FIG. 47 is a plan view illustrating a configuration example of the semiconductor device according to the sixteenth embodiment. In the sixteenth embodiment, a plurality of electronic components 110 is built in the through hole 500 of the frame 20. In this way, the plurality of electronic components 110 may be built in through hole 500 by changing the size of through hole 500.

In addition, as illustrated in FIG. 46, even though the plurality of electronic components 110 has different thicknesses (heights) from each other, upper surfaces of the plurality of components 110 can be aligned to be substantially flush with the third surface 20A (or the fourth surface 20B) of the frame 20 by manufacturing the semiconductor device in the same manner as in the fourteenth embodiment. As a result, the plurality of electronic components 110 that is different in area or height (thickness) can be arranged in the through hole 500 and connected to the laminated wiring part 81 (or 82).

The other configurations in the sixteenth embodiment may be similar to the corresponding configurations in the fourteenth embodiment. As a result, the sixteenth embodiment can obtain the same effects as the fourteenth embodiment.

Furthermore, the sixteenth embodiment may be combined with the fifteenth embodiment. For example, by variously changing the depth and the area of the counterbore 501 according to the fifteenth embodiment, a plurality of electronic components 110 having different heights or areas can be built in the counterbores 501 of the frame 20.

Seventeenth Embodiment

Figure 48:
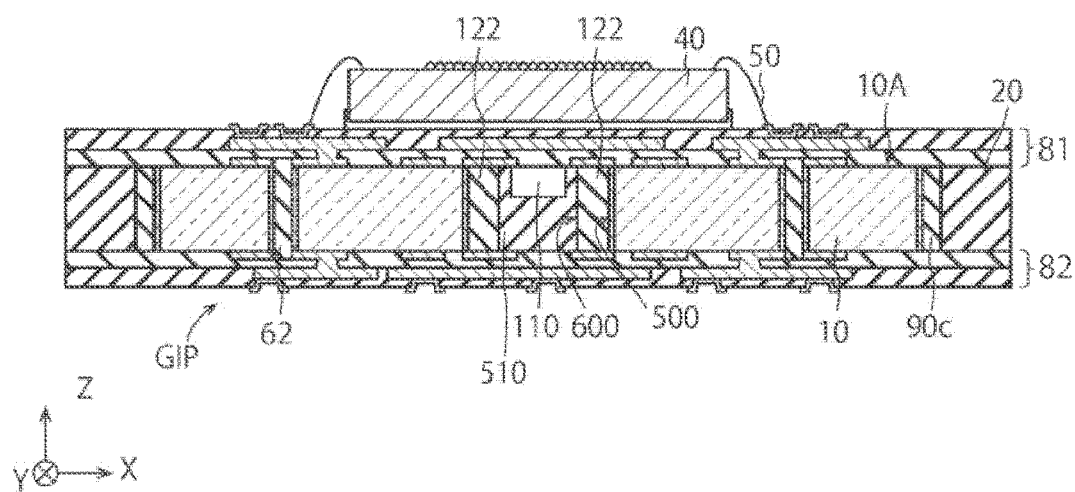
FIG. 48 is a cross-sectional view illustrating a configuration example of a semiconductor device according to a seventeenth embodiment.
Figure 49:
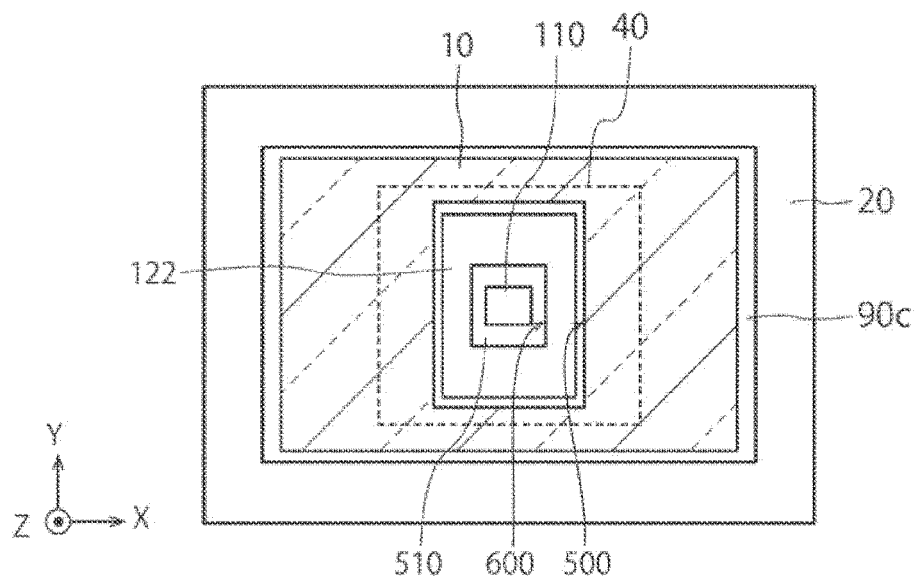
FIG. 49 is a plan view illustrating a configuration example of the semiconductor device according to the seventeenth embodiment.

FIG. 48 is a cross-sectional view illustrating a configuration example of a semiconductor device according to a seventeenth embodiment. FIG. 49 is a plan view illustrating a configuration example of the semiconductor device according to the seventeenth embodiment. In the seventeenth embodiment, a heat dissipation member 122 is built in the through hole 500 of the glass substrate 10, and an electronic component 110 is built in a through hole (a second through hole) 600 provided in the heat dissipation member 122. The heat dissipation member 122 is formed in a size to be accommodatable in the through hole 500, and has a through hole 600 to accommodate an electronic component 110 therein. When viewed in the Z direction, an outer edge of the heat dissipation member 122 has, for example, a substantially similar shape to the through hole 500, and is smaller than the through hole 500 as illustrated in FIG. 49. The through hole 600 of the heat dissipation member 122 is has a substantially similar shape to the electronic component 110, and is larger than the electronic component 110. Therefore, the heat dissipation member 122 is molded in a frame shape when viewed in the Z direction. The heat dissipation member 122 may have a height (thickness) in the Z direction substantially equal to or slightly smaller than that of the glass substrate 10. For the heat dissipation member 122, for example, a material having high thermal conductivity such as copper or silicon is used.

The through hole 600 of the heat dissipation member 122 may be formed using a lithography technique and an etching technique. Alternatively, the through hole 600 of the heat dissipation member 122 may be formed by scraping the heat dissipation member 122 using laser ablation.

In a method for manufacturing the module according to the seventeenth embodiment, the frame 20 with the through hole 500 formed therein is mounted on the support substrate 502, and the heat dissipation member 122 with the through hole 600 formed therein is mounted on the support substrate 502 in the through hole 500. Further, an electronic component 110 is mounted on the support substrate 502 in the through hole 600. The subsequent steps may be the same as those in the manufacturing method in the tenth embodiment.

According to the seventeenth embodiment, the heat dissipation member 122 can quickly transfer heat from the semiconductor chip 40 and the electronic component 110 to the second surface 10B side of the glass substrate 10 to exhaust the heat. In addition, in a case where the heat dissipation member 122 includes silicon, a difference in selective expansion coefficient between the heat dissipation member 122 and the glass substrate 10 is small. As a result, the warpage of the package is suppressed, leading to an improvement in reliability. In the seventeenth embodiment, the frame 20 may be omitted.

Eighteenth Embodiment

Figure 50:
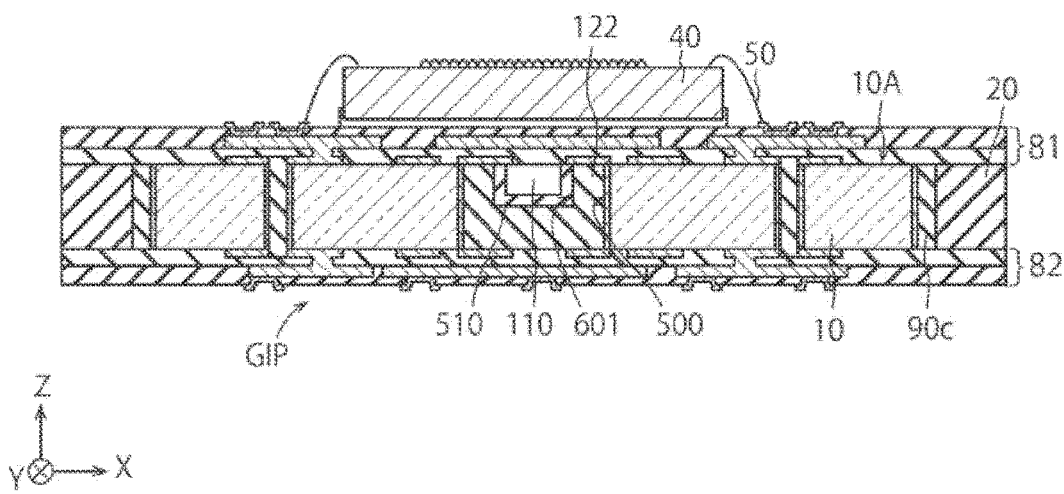
FIG. 50 is a cross-sectional view illustrating a configuration example of a semiconductor device according to an eighteenth embodiment.

FIG. 50 is a cross-sectional view illustrating a configuration example of a semiconductor device according to an eighteenth embodiment. A plan view of the semiconductor device according to the eighteenth embodiment may be the same as that of FIG. 49. In the eighteenth embodiment, a counterbore (recess) 601 is provided in the heat dissipation member 122, and an electronic component 110 is disposed in the counterbore (second counterbore) 601. The counterbore 601 does not penetrate through the heat dissipation member 122 so as to have a bottom. The counterbore 601 is formed to have a size capable of accommodating the electronic component 110. An insulating film 510 is filled in a space of the counterbore 601 in which the electronic component 110 is not placed.

The counterbore 601 may be formed by a lithography technique and an etching technique, or may be formed using laser ablation.

The other configurations in the eighteenth embodiment may be similar to the corresponding configurations in the seventeenth embodiment. Therefore, the eighteenth embodiment can obtain the same effects as the seventeenth embodiment. In addition, according to the eighteenth embodiment, the heat dissipation member 122 is provided to cover a side portion and a bottom portion of the electronic component 110. Therefore, the heat dissipation function of the heat dissipation member 122 is improved. In the eighteenth embodiment, the frame 20 may be omitted.

In the seventeenth and eighteenth embodiments, a plurality of electronic components 110 may be provided in the through hole 600 or in the counterbore 601.

Nineteenth Embodiment

Figure 51:
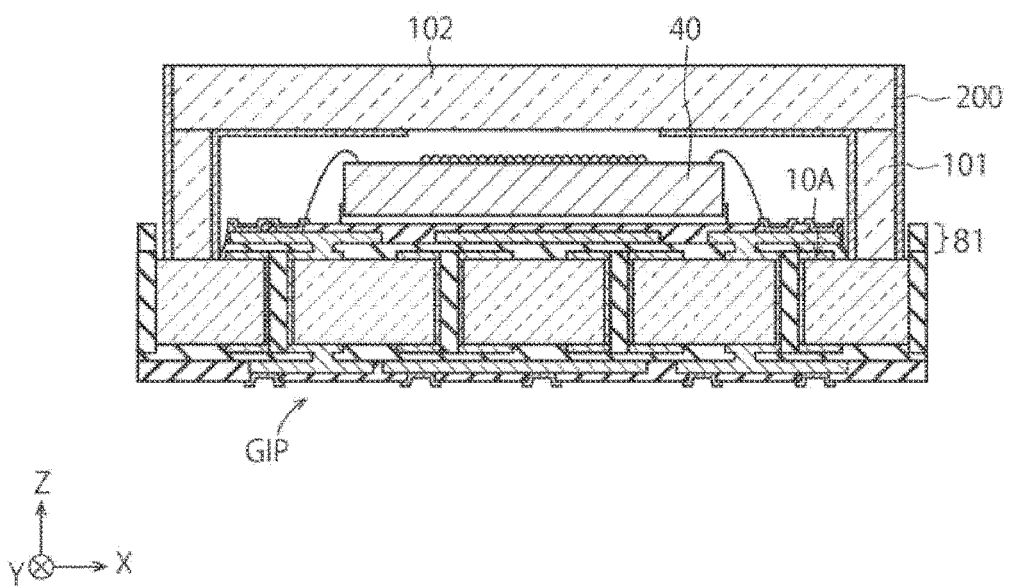
FIG. 51 is a cross-sectional view illustrating an example of a semiconductor device according to a nineteenth embodiment.

FIG. 51 is a cross-sectional view illustrating an example of a semiconductor device according to a nineteenth embodiment. The GIP may be one according to any of the embodiments or modifications thereof described above. According to the nineteenth embodiment, not only the cover glass 102 in FIG. 20 but also the fixing frame 101 includes glass. The fixing frame (glass frame) 101 is provided to surround the periphery of the semiconductor chip 40, and has a substantially rectangular cylindrical shape. Furthermore, the insulating films 85$a$ and 90$a$ on the first surface 10A of the glass substrate 10 are partially removed, and one end of the fixing frame 101 is in direct contact with the first surface 10A of the glass substrate 10. For the fixing frame 101, for example, the same type of glass as that used for the glass substrate 10 or a glass material having a linear expansion coefficient close to that of the glass material of the glass substrate 10 is used.

The cover glass 102 is connected to the other end of the fixing frame 101, and is provided to cover an upper side of the semiconductor chip 40. For the cover glass 102 as well, for example, the same type of glass as that used for the glass substrate 10 or a glass material having a linear expansion coefficient close to that of the glass material of the glass substrate 10 is used. It is preferable that the same material is used for the fixing frame 101 and the cover glass 102.

In a case where the linear expansion coefficients of the fixing frame 101 and the glass substrate 10 are greatly different from each other, even if the linear expansion coefficients of the semiconductor chip 40 and the glass substrate 10 are close to each other to reduce warpage, the entire package is warped due to the difference in linear expansion coefficient between the fixing frame 101 and the glass substrate 10.

In this regard, according to the nineteenth embodiment, the fixing frame 101 includes a glass material having a linear expansion coefficient equal to or close to that of the glass substrate 10. As a result, the warpage of the package can be suppressed by the fixing frame 101.

A light shielding film 200 is provided on partial portions of the surfaces of the fixing frame 101 and the cover glass 102. The light shielding film 200 is provided for the semiconductor chip 40 such as a CIS to block unnecessary light. It is only required that a region in which the light shielding film 200 is formed be arbitrarily set according to the purpose. For the light shielding film 200, for example, a material having a low surface reflectance such as a light shielding metal material such as chromium or a light shielding resin is used.

The fixing frame 101 and the cover glass 102 are formed as follows. First, a substantially rectangular glass substrate having a flat plate shape is prepared, and a center region of the glass substrate is irradiated with laser light to change the quality the glass substrate. The center region is cut out to form a hollow therethrough by etching the quality-changed portion with a hydrofluoric acid solution or the like, such that the frame-shaped fixing frame 101 is formed. Alternatively, laser ablation may be used to scrape the glass substrate.

Next, the fixing frame 101 is bonded to the cover glass 102 using an adhesive or the like.

Next, a protective film is attached to a region in which no light shielding film 200 is to be provided on surfaces of the fixing frame 101 and the cover glass 102. Then, the light shielding film 200 is deposited on the surfaces of the fixing frame 101 and the cover glass 102. By peeling off the protective film from the fixing frame 101 and the cover glass 102, the light shielding film 200 deposited on the protective film is removed together with the protective film. In this way, the light shielding film 200 is formed in desired regions of the fixing frame 101 and the cover glass 102.

Meanwhile, partial portions of the insulating films 85$a$ and 90$a$ of the GIP, on which the semiconductor chip 40 is mounted, are trimmed by laser light or the like. As a result, an outer end of the glass substrate 10 corresponding to an end of the fixing frame 101 is exposed from the insulating films 85$a$ and 90$a$ (the wiring layer 81).

Next, the end of the fixing frame 101 is directly bonded to the glass substrate 10. The bonding between the fixing frame 101 and the cover glass 102 and the bonding between the fixing frame 101 and the glass substrate 10 may be achieved by using an adhesive, or using another adhesion method such as frit glass or chemical bond. Note that the fixing frame 101 may be bonded onto the insulating films 85$a$ and 90$a$ (the wiring layer 81) without trimming the glass substrate 10.

Twentieth Embodiment

Figure 52:
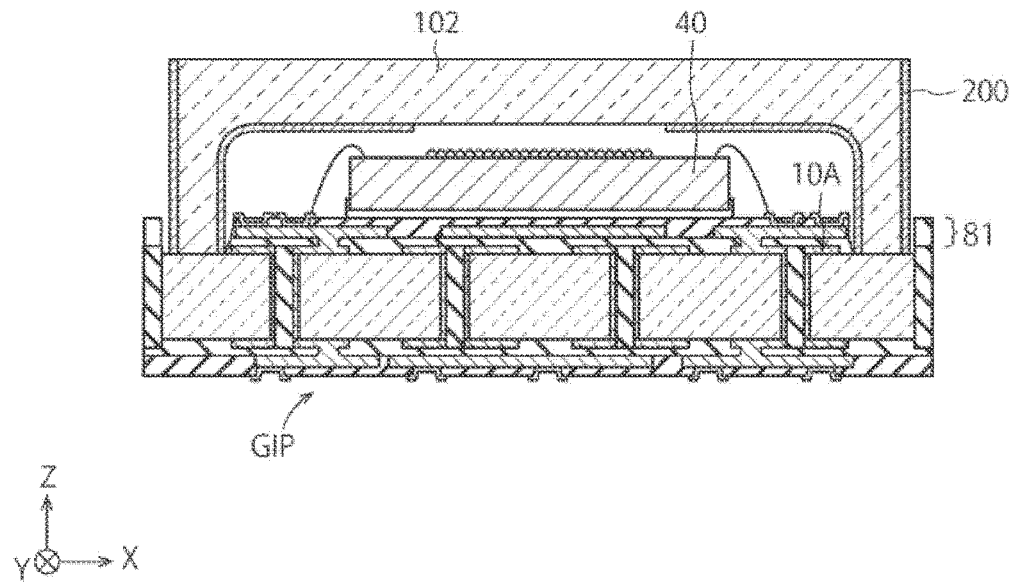
FIG. 52 is a cross-sectional view illustrating an example of a semiconductor device according to a twentieth embodiment.

FIG. 52 is a cross-sectional view illustrating an example of a semiconductor device according to a twentieth embodiment. The twentieth embodiment is different from the nineteenth embodiment in that the fixing frame 101 and the cover glass 102 are integrally formed of the same material. In the twentieth embodiment, bonding between the fixing frame 101 and the cover glass 102 is not necessary, and accordingly, it is possible to reduce the number of parts. The other configurations in the twentieth embodiment may be similar to the corresponding configurations in the nineteenth embodiment. Therefore, the twentieth embodiment can obtain the same effects as the nineteenth embodiment. Hereinafter, since the fixing frame 101 and the cover glass 102 are integrally formed, they are simply referred to as "cover glass 102".

The cover glass 102 is formed as follows. First, a substantially rectangular glass substrate having a flat plate shape is prepared, and a center region of the glass substrate is irradiated with laser light to change the quality the glass substrate. At this time, an intensity of the laser light is adjusted to change the quality of the glass substrate up to the middle of its thickness. Next, the center region is cut out by etching the quality-changed portion of the glass substrate with a hydrofluoric acid solution or the like, so as to form a cover glass 102 having a counterbore. At this time, the center region of the cover glass 102 is cut out to have a recess, but is not entirely cut out to form a hole therethrough. Alternatively, laser ablation may be used to scrape the glass substrate.

Next, a protective film is attached to a region in which no light shielding film 200 is to be provided on surfaces of the cover glass 102. Then, a light shielding film 200 is deposited on the surfaces of the cover glass 102. By peeling off the protective film from the fixing frame 101 and the cover glass 102, the light shielding film 200 deposited on the protective film is removed together with the protective film. In this way, the light shielding film 200 is formed in desired regions of the fixing frame 101 and the cover glass 102.

Thereafter, similarly to the nineteenth embodiment, the cover glass 102 is bonded onto the glass substrate 10.

(Modification)

Figure 53:
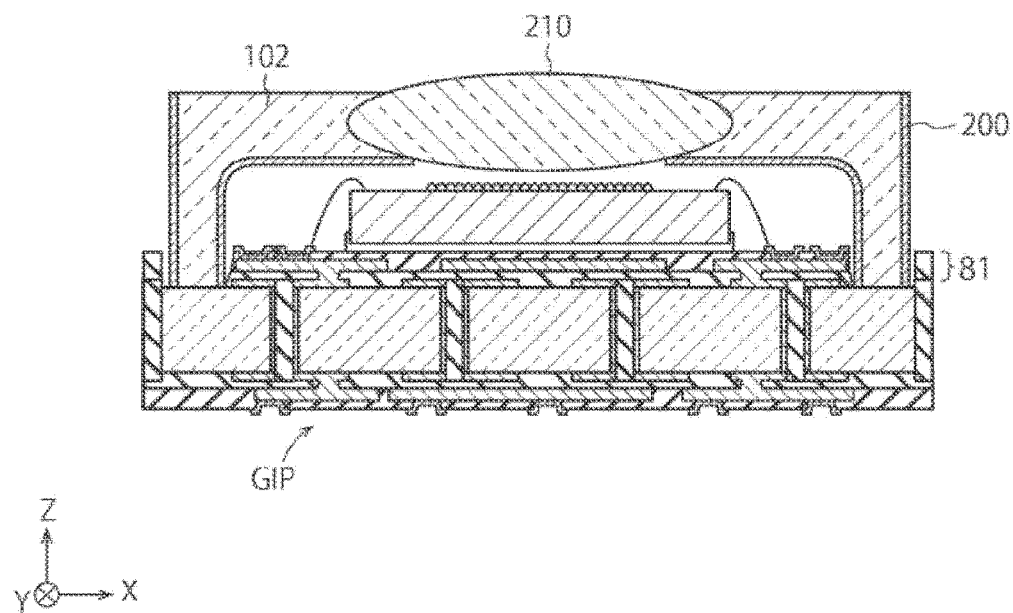
FIG. 53 is a cross-sectional view illustrating a configuration example of a semiconductor device according to a modification of the twentieth embodiment.

FIG. 53 is a cross-sectional view illustrating a configuration example of a semiconductor device according to a modification of the twentieth embodiment. The present modification is different from the twentieth embodiment in that a lens 210 is integrally formed with the cover glass 102 using the same material. Such a configuration makes it possible to simultaneously form the fixing frame, the cover glass 102, and the lens 210, thereby reducing a manufacturing cost, reducing the number of parts, and reducing a module size. The other configurations in the present modification may be similar to the corresponding configurations in twentieth embodiment. Therefore, the present modification can obtain the same effects as the twentieth embodiment.

The modification may be combined with the nineteenth embodiment.

(Modification)

Figure 54:
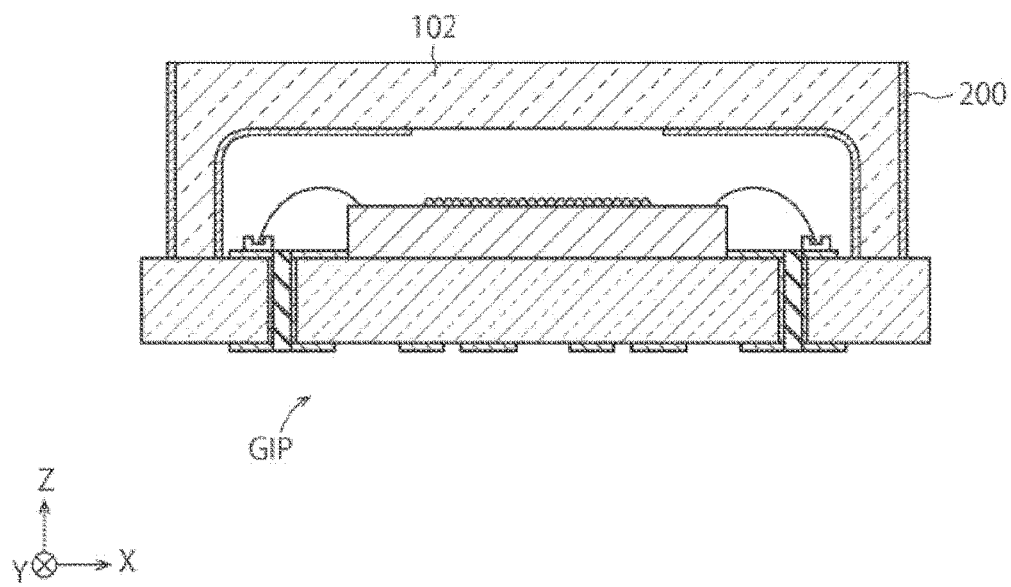
FIG. 54 is a cross-sectional view illustrating a configuration example of a semiconductor device according to another modification of the twentieth embodiment.

FIG. 54 is a cross-sectional view illustrating a configuration example of a semiconductor device according to another modification of the twentieth embodiment. In the present modification, most wiring layers of the laminated wiring parts 81 and 82 are omitted, except wiring layers directly provided on the first surface 10A and the second surface 10B of the glass substrate 10. Furthermore, the frame 20 is also omitted.

Since the insulating films 85a, 85b, 90a, and 90b are not provided on the glass substrate 10, the package includes materials most of which are identical or similar in linear expansion coefficient. Therefore, even though there is a change in temperature, the warpage or deformation caused in the package is small. In addition, glass has a lower dielectric constant than the insulating films 85a, 85b, 90a, and 90b including a resin or the like. Therefore, the power loss in the package in the present modification is small.

The other configurations in the present modification may be similar to the corresponding configurations in twentieth embodiment. Therefore, the present modification can obtain the same effects as the twentieth embodiment. The present modification may be combined with the nineteenth embodiment.

<15. Use Example of Imaging Apparatus to which Present Technology is Applied>

Figure 55:
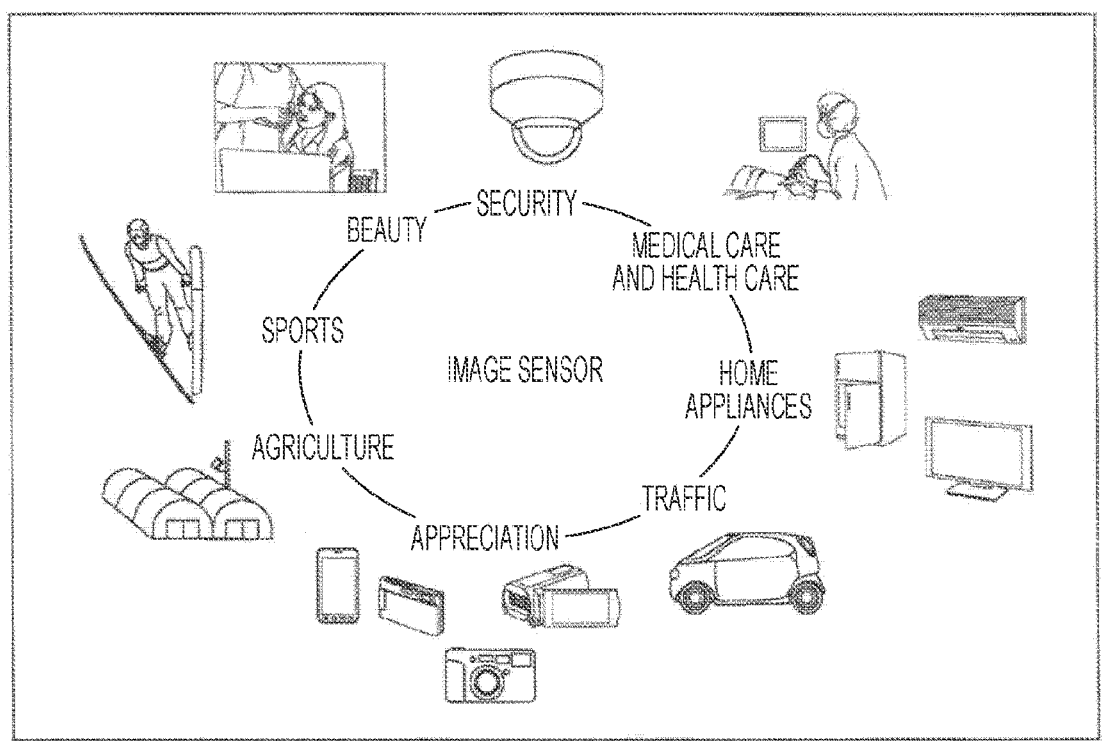
FIG. 55 is a diagram illustrating an example in which the embodiment according to the present technology is used as a CMOS image sensor.

FIG. 55 is a diagram illustrating an example in which the embodiment according to the present technology is used as a CMOS image sensor.

The imaging apparatus according to the above-described embodiments can be used in various cases, for example, when light, such as visible light, infrared light, ultraviolet light, and X-rays, is sensed as follows. That is, as illustrated in FIG. 55, for example, the above-described embodiments can be used in devices used in the field of appreciation in which images to be provided for appreciation are captured, the field of traffic, the field of home appliances, the field of medical care and health care, the field of security, the field of beauty, the field of sports, the field of agriculture, and the like.

Specifically, in the field of appreciation, the above-described embodiments can be used, for example, for devices for capturing images to be provided for appreciation, such as a digital camera, a smartphone, or a mobile phone having a camera function.

In the field of traffic, the above-described embodiments can be used, for example, for devices provided for traffic purposes, such as a vehicle sensor that captures images of the front, rear, surroundings, inside, and the like of an automobile for safe driving such as automated stop, recognition of driver's condition, and the like, a monitoring camera that monitors traveling vehicles and roads, and a distance measurement sensor that measures a distance between vehicles and the like.

In the field of home appliances, the above-described embodiments can be used, for example, for devices each provided to capture an image of a user's gesture and operate the device according to the gesture, such as a television receiver, a refrigerator, and an air conditioner.

In the field of medical care and health care, the above-described embodiments can be used, for example, for devices provided for medical care and health care, such as an endoscope and a device that performs angiography by receiving infrared light.

In the field of security, for example, the above-described embodiments can be used, for example, for devices provided for security, such as a monitoring camera for preventing crime or a camera for authenticating a person.

In the field of beauty, the above-described embodiments can be used, for example, for devices provided for beauty, such as a skin inspection instrument for imaging a skin and a microscope for imaging a scalp.

In the field of sports, the above-described embodiments can be used, for example, for devices provided for sports, such as an action camera and a wearable cameras for sports.

In the field of agriculture, the above-described embodiments can be used, for example, for devices provided for agriculture, such as a camera for monitoring a condition of a field or a crop.

The present technology can be applied to various other products.

The embodiments according to the present technology are not limited to the above-described embodiments, and various modifications can be made without departing from the gist of the present technology.

Furthermore, the effects described in the present specification are merely examples and are not limited, and there may be other effects as well.

Furthermore, the present technology can have the following configurations.

(1)

A semiconductor device including:

a glass substrate including a first surface, a second surface opposite to the first surface, and a first side surface between the first surface and the second surface;

wirings provided on the first and second surfaces;

a first insulating film that covers the first surface;

a second insulating film that covers the second surface; and a third insulating film that covers the first side surface, the third insulating film being continuous with at least one of the first and second insulating films.

(2)

The semiconductor device according to (1), in which the first to third insulating films are continuously provided on the first side surface, the first surface, and the second surface.

(3)

The semiconductor device according to (1) or (2), in which the first to third insulating films include the same material.

(4)

The semiconductor device according to any one of (1) to (3), in which partial portions of the wirings directly contact the glass substrate on the first and second surfaces.

(5)

The semiconductor device according to any one of (1) to (4), in which the number of layers of the wiring and the number of layers of the first insulating film on the first surface are the same as the number of layers of the wiring and the number of layers of the second insulating film on the second surface, respectively.

(6)

The semiconductor device according to any one of (1) to (5), further including:
- a first metal film that covers an inner wall of a through hole penetrating through the glass substrate between the first surface and the second surface; and
- a fourth insulating film filled inside the first metal film in the through hole,
- in which the fourth insulating film includes the same material as and is continuous with the first and second insulating films.

(7)

The semiconductor device according to (4) or (6), in which each of the partial portions of the wirings directly contacting the glass substrate has an opening above the through hole.

(8)

The semiconductor device according to any one of (1) to (7), in which a side surface of the third insulating film is flat.

(9)

The semiconductor device according to any one of (1) to (8), further including a frame provided outside the third insulating film on the first side surface.

(10)

The semiconductor device according to (9), in which the frame has a third surface on the same side as the first surface, a fourth surface on the same side as the second surface, and a second side surface facing the first side surface,
- the first insulating film is provided continuously from the first surface to the third surface, and
- the second insulating film is continuously provided from the second surface to the fourth surface.

(11)

The semiconductor device according to (10), further including:
- a second metal film provided on the third surface of the frame; and
- a third metal film provided on the fourth surface of the frame.

(12)

The semiconductor device according to any one of (9) to (11), in which the frame includes a material having a linear expansion coefficient substantially equal to that of the glass substrate.

(13)

The semiconductor device according to any one of (1) to (12), in which the first side surface of the glass substrate has a curved shape to protrude outward in a cross section in a direction perpendicular to the first surface.

(14)

The semiconductor device according to (6), in which the first side surface of the glass substrate has a curved shape to protrude outward in a cross section in a direction perpendicular to the first surface,
- an inner side surface of the through hole has a curved shape to protrude inward of the through hole in the cross section in the direction perpendicular to the first surface, and
- the first side surface has a curvature substantially equal to that of the inner side surface of the through hole.

(15)

The semiconductor device according to any one of (1) to (14), further including:
- a metal plate provided in a second through hole penetrating through the glass substrate between the first surface and the second surface; and
- a fifth insulating film provided between the second through hole and the metal plate and continuous with at least one of the first and second insulating films.

(16)

The semiconductor device according to (15), in which an inner wall surface of the second through hole and a side surface of the metal plate are inclined with respect to the first surface or the second surface.

(17)

The semiconductor device according to any one of (1) to (16), further including an alignment mark provided on the first surface of the glass substrate.

(18)

The semiconductor device according to (11), in which the second and third metal films are used as antennas for wireless communication.

(19)

The semiconductor device according to any one of (1) to (18), in which an antenna is mounted on the first surface of the glass substrate.

(20)

The semiconductor device according to any one of (1) to (18), in which a semiconductor chip is mounted on the first surface of the glass substrate.

(21)

The semiconductor device according to (20), in which the semiconductor chip is an image sensor chip.

(22)

A semiconductor device including:
- a glass substrate including a first surface, a second surface opposite to the first surface, and a first side surface between the first surface and the second surface, the glass substrate having a fastening hole penetrating therethrough between the first surface and the second surface;
- wiring layers provided on the first and second surfaces;
- a semiconductor chip provided above the glass substrate;
- a housing provided around the semiconductor chip;
- a lens provided in the housing; and
- a fastener that fastens the glass substrate and the housing to each other via the fastening hole.

(23)

The semiconductor device according to (22), in which the fastening hole is larger than an outer diameter of a head of the fastener in plan view when the fastening hole is viewed in a fastened direction of the fastener.

(24)

The semiconductor device according to (23), further including a filler that fills a space between the fastener and the fastening hole.

(25)

The semiconductor device according to any one of (22) to (24), in which the fastening hole is connected to the outside on the side surface of the glass substrate.

(26)

The semiconductor device according to any one of (22) to (25), in which a plurality of fastening holes is provided in the glass substrate, and
- the center between the plurality of fastening holes overlaps the semiconductor chip in plan view when the plurality of fastening holes is viewed in the fastened direction.

(27)

The semiconductor device according to any one of (22) to (25), in which the fastener fastens the housing and the glass substrate to each other so that an optical axis of the lens and an optical axis of the semiconductor chip substantially coincide with each other.

(28)

The semiconductor device according to any one of (1) to (21), in which the glass substrate has a through hole penetrating therethrough between the first surface and the second surface, and the semiconductor device further includes an electronic component provided in the through hole and connected to one of the wirings.

(29)

The semiconductor device according to any one of (9) to (12), in which the frame has a through hole penetrating therethrough between the third surface and the fourth surface, and the semiconductor device further includes an electronic component provided in the through hole and connected to one of the wirings.

(30)

The semiconductor device according to any one of (1) to (21), in which the glass substrate has a counterbore provided in the first surface, and the semiconductor device further includes an electronic component provided in the counterbore and connected to one of the wirings.

(31)

The semiconductor device according to any one of (9) to (12), in which the frame has a counterbore provided in the third surface, and the semiconductor device further includes an electronic component provided in the counterbore and connected to one of the wirings.

(32)

The semiconductor device according to (28), in which a plurality of electronic components having different thicknesses is provided in the through hole, and surfaces of the plurality of electronic components are aligned with the first surface.

(33)

The semiconductor device according to (29), in which a plurality of electronic components having different thicknesses is provided in the through hole, and surfaces of the plurality of electronic components are aligned with the first surface.

(34)

The semiconductor device according to (30), in which a plurality of electronic components having different thicknesses is provided in a plurality of counterbores having different depths, respectively, and surfaces of the plurality of electronic components are aligned with the first surface.

(35)

The semiconductor device according to (31), in which a plurality of electronic components having different thicknesses is provided in a plurality of counterbores having different depths, respectively, and surfaces of the plurality of electronic components are aligned with the first surface.

(36)

The semiconductor device according to (28), in which the glass substrate has a through hole penetrating therethrough between the first surface and the second surface, the semiconductor device further includes a heat dissipation member provided in the through hole and having a second through hole, and the electronic component is provided in the second through hole.

(37)

The semiconductor device according to (28), further including a heat dissipation member provided in the through hole and having a second counterbore, in which the electronic component is provided in the second counterbore.

(38)

The semiconductor device according to (1), further including:

a glass frame of which one end is directly connected to the first surface of the glass substrate and which is provided to surround a periphery of the semiconductor chip; and a cover glass connected to the other end of the glass frame to cover an upper side of the semiconductor chip.

(39)

The semiconductor device according to (22), further including:

a glass frame of which one end is directly connected to the first surface of the glass substrate and which is provided to surround a periphery of the semiconductor chip; and a cover glass connected to the other end of the glass frame to cover an upper side of the semiconductor chip.

(40)

The semiconductor device according to (38), in which the glass frame and the cover glass are integrally formed.

(41)

The semiconductor device according to (39), in which the glass frame and the cover glass are integrally formed.

(42)

The semiconductor device according to (40), in which the glass frame and the cover glass include the same material as the glass substrate.

(43)

The semiconductor device according to (41), in which the glass frame and the cover glass include the same material as the glass substrate.

(44)

The semiconductor device according to (38), further including a light shielding film provided on partial portions of surfaces of the glass frame and the cover glass.

(45)

The semiconductor device according to (39), further including a light shielding film provided on partial portions of surfaces of the glass frame and the cover glass.

Note that the present disclosure is not limited to the above-described embodiments, and various modifications can be made without departing from the gist of the present disclosure. Furthermore, the effects described in the present specification are merely examples and are not limited, and there may be other effects.

REFERENCE SIGNS LIST

10 Glass substrate
11 Opening
20 Frame
30 Metal film
40 Semiconductor chip
50 Bonding wire
60 Through electrode
61 Metal film
62 Insulating film
81, 82 Laminated wiring part
90a to 90c Insulating film

The invention claimed is:

1. A semiconductor device, comprising:
   a glass substrate that includes:
      a first surface,
      a second surface opposite to the first surface, and
      a first side surface between the first surface and the second surface;
   a plurality of wirings that includes:
      a first wiring on the first surface, and
      a second wiring on the second surface;
   a first insulating film that covers the first surface;
   a second insulating film that covers the second surface;
   a third insulating film that covers the first side surface, wherein the third insulating film is continuous with at least one of the first insulating film or the second insulating film;
   a first through hole that penetrates through the glass substrate between the first surface and the second surface;
   a first metal film that covers an inner wall of the first through hole; and
   a fourth insulating film inside the first metal film in the first through hole.

2. The semiconductor device according to claim 1, wherein the first insulating film, the second insulating film, and the third insulating film are continuous on the first side surface, the first surface, and the second surface.

3. The semiconductor device according to claim 1, wherein the first insulating film, the second insulating film, and the third insulating film include a same material.

4. The semiconductor device according to claim 1, wherein a plurality of partial portions of the plurality of wirings directly contacts the glass substrate on the first surface and the second surface.

5. The semiconductor device according to claim 1, wherein a number of layers of the first wiring and a number of layers of the first insulating film on the first surface are same as a number of layers of the second wiring and a number of layers of the second insulating film on the second surface, respectively.

6. The semiconductor device according to claim 1, wherein
   the fourth insulating film includes a same material as the first insulating film and the second insulating film, and
   the fourth insulating film is continuous with the first insulating film and the second insulating film.

7. The semiconductor device according to claim 4, wherein each of the plurality of partial portions of the plurality of wirings has an opening above the first through hole.

8. The semiconductor device according to claim 1, wherein a third side surface of the third insulating film is flat.

9. The semiconductor device according to claim 1, further comprising a frame outside the third insulating film on the first side surface.

10. The semiconductor device according to claim 9, wherein
    the frame includes:
       a third surface on a same side as the first surface,
       a fourth surface on a same side as the second surface, and
       a second side surface facing the first side surface,
    the first insulating film is continuous from the first surface to the third surface, and
    the second insulating film is continuous from the second surface to the fourth surface.

11. The semiconductor device according to claim 10, further comprising:
    a second metal film on the third surface of the frame; and
    a third metal film on the fourth surface of the frame.

12. The semiconductor device according to claim 9, wherein
    the frame includes a first material having a first linear expansion coefficient,
    the glass substrate includes a second material having a second linear expansion coefficient, and
    the first linear expansion coefficient is equal to the second linear expansion coefficient.

13. The semiconductor device according to claim 1, wherein the first side surface of the glass substrate has a curved shape that protrudes outward in a cross section in a direction perpendicular to the first surface.

14. The semiconductor device according to claim 1, wherein the first side surface of the glass substrate has a curved shape that protrudes outward in a cross section in a direction perpendicular to the first surface,
    an inner side surface of the first through hole has a curved shape that protrudes inward of the first through hole in the cross section in the direction perpendicular to the first surface, and
    the first side surface has a curvature equal to that of the inner side surface of the first through hole.

15. The semiconductor device according to claim 1, further comprising:
    a second through hole that penetrates through the glass substrate between the first surface and the second surface, wherein the second through hole includes a metal plate; and
    a fifth insulating film between the second through hole and the metal plate, wherein the fifth insulating film is continuous with at least one of the first insulating film or the second insulating film.

16. The semiconductor device according to claim 15, wherein an inner wall surface of the second through hole and a side surface of the metal plate are inclined with respect to at least one of the first surface or the second surface.

17. The semiconductor device according to claim 1, further comprising an alignment mark on the first surface of the glass substrate.

18. The semiconductor device according to claim 11, wherein the second metal film and the third metal film are a plurality of antennas for wireless communication.

19. The semiconductor device according to claim 1, further comprising an antenna is on the first surface of the glass substrate.

20. The semiconductor device according to claim 1, further comprising a semiconductor chip on the first surface of the glass substrate.

21. The semiconductor device according to claim 20, wherein the semiconductor chip is an image sensor chip.

22. The semiconductor device according to claim 1, comprising an electronic component in the first through hole, wherein the electronic component is connected to one of the plurality of wirings.

23. The semiconductor device according to claim 10, wherein
    the frame has a third through hole that penetrates through the glass substrate between the third surface and the fourth surface,
    the semiconductor device further comprising an electronic component in the third through hole, and
    the electronic component is connected to one of the plurality of wirings.

24. The semiconductor device according to claim 1, wherein
the glass substrate has a first counterbore in the first surface,
the semiconductor device further comprising an electronic component in the first counterbore, and
the electronic component is connected to one of the plurality of wirings.

25. The semiconductor device according to claim 10, wherein
the frame has a first counterbore in the third surface,
the semiconductor device further comprising an electronic component in the first counterbore, and
the electronic component is connected to one of the plurality of wirings.

26. The semiconductor device according to claim 22, further comprising a plurality of electronic components including the electronic component, wherein
each of the plurality of electronic components has a different thickness,
the plurality of electronic components is in the first through hole,
the plurality of electronic components includes a plurality of surfaces, and
each of the plurality of surfaces is aligned with the first surface.

27. The semiconductor device according to claim 23, further comprising a plurality of electronic components including the electronic component, wherein
each of the plurality of electronic components has a different thickness,
the plurality of electronic components is in the third through hole,
the plurality of electronic components includes a plurality of surfaces, and
each of the plurality of surfaces is aligned with the first surface.

28. The semiconductor device according to claim 24, further comprising:
a plurality of electronic components including the electronic component; and
a plurality of counterbores including the first counterbore, wherein
each of the plurality of electronic components has a different thickness,
the each of the plurality of electronic components is in a respective counterbore of the plurality of counterbores that has a different depth,
the plurality of electronic components includes a plurality of surfaces, and
each of the plurality of surfaces is aligned with the first surface.

29. The semiconductor device according to claim 25, further comprising:
a plurality of electronic components including the electronic component; and
a plurality of counterbores including the first counterbore, wherein
each of the plurality of electronic components has a different thickness,
the each of the plurality of electronic components is in a respective counterbore of the plurality of counterbores that has a different depth,
the plurality of electronic components includes a plurality of surfaces, and
each of the plurality of surfaces is aligned with the first surface.

30. The semiconductor device according to claim 22, further comprising a heat dissipation member in the first through hole, wherein
the heat dissipation member includes a second through hole, and
the electronic component is in the second through hole.

31. The semiconductor device according to claim 22, further comprising a heat dissipation member in the first through hole, wherein
the heat dissipation member includes a second counterbore, and
the electronic component is in the second counterbore.

32. The semiconductor device according to claim 1, further comprising:
a semiconductor chip;
a glass frame that includes a first end and a second end, wherein
the first end of the glass frame is directly connected to the first surface of the glass substrate, and
the glass frame surrounds a periphery of the semiconductor chip; and
a cover glass connected to the second end of the glass frame to cover an upper side of the semiconductor chip.

33. The semiconductor device according to claim 32, wherein the glass frame and the cover glass are integrated.

34. The semiconductor device according to claim 33, wherein the glass frame, the cover glass, and the glass substrate include a same material.

35. The semiconductor device according to claim 32, further comprising a light shielding film that shields partial portions of surfaces of the glass frame and surfaces of the cover glass.

36. A semiconductor device, comprising:
a glass substrate that includes:
a first surface,
a second surface opposite to the first surface, and
a first side surface between the first surface and the second surface, wherein the glass substrate has a fastening hole that penetrates through each of the first surface and the second surface of the glass substrate;
a plurality of wiring layers that includes:
a first wiring layer on the first surface, and
a second wiring layer on the second surface;
a semiconductor chip above the glass substrate;
a housing around the semiconductor chip;
a lens in the housing; and
a fastener that fastens the glass substrate with the housing via the fastening hole, wherein
in a case where the fastening hole is viewed in a fastened direction of the fastener, a diameter of the fastening hole is larger than an outer diameter of a head of the fastener in plan view.

37. The semiconductor device according to claim 36, further comprising a filler that fills a space between the fastener and the fastening hole.

38. The semiconductor device according to claim 36, wherein the fastening hole is connected to outside on the first side surface of the glass substrate.

39. The semiconductor device according to claim 36, wherein
the glass substrate includes a plurality of fastening holes,
the plurality of fastening holes includes the fastening hole, and in a case where the plurality of fastening holes is viewed in the fastened direction, a center between the plurality of fastening holes overlaps the semiconductor chip in the plan view.

40. The semiconductor device according to claim 36, wherein
the housing is fastened with the glass substrate to coincide an optical axis of the lens with an optical axis of the semiconductor chip.

41. The semiconductor device according to claim 36, further comprising:
a glass frame that includes a first end and a second end, wherein the first end of the glass frame is directly connected to the first surface of the glass substrate, and the glass frame surrounds a periphery of the semiconductor chip; and
a cover glass connected to the second end of the glass frame to cover an upper side of the semiconductor chip.

42. The semiconductor device according to claim 41, wherein the glass frame and the cover glass are integrated.

43. The semiconductor device according to claim 42, wherein the glass frame, the cover glass, and the glass substrate include a same material.

44. The semiconductor device according to claim 41, further comprising a light shielding film on a plurality of partial portions of a plurality of surfaces of the glass frame and a plurality of partial portions of a plurality of surfaces of the cover glass.

* * * * *